(12) United States Patent
Shi et al.

(10) Patent No.: US 10,622,943 B2
(45) Date of Patent: Apr. 14, 2020

(54) OSCILLATOR

(71) Applicant: Huawei Technologies Co., Ltd., Shenzhen (CN)

(72) Inventors: Kai Shi, Shanghai (CN); Lei Lu, Shanghai (CN); Lei Xie, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/232,726

(22) Filed: Dec. 26, 2018

(65) Prior Publication Data

US 2019/0131930 A1 May 2, 2019

Related U.S. Application Data

(63) Continuation of application No. PCT/CN2016/090223, filed on Jul. 15, 2016.

(51) Int. Cl.
*H03B 5/12* (2006.01)
*H03L 7/099* (2006.01)
(Continued)

(52) U.S. Cl.
CPC ......... *H03B 5/1228* (2013.01); *H03B 5/1212* (2013.01); *H03B 5/1265* (2013.01);
(Continued)

(58) Field of Classification Search
CPC .......... H03B 5/1228; H03B 2200/0062; H03B 2200/0058; H03B 2200/005;
(Continued)

(56) References Cited

U.S. PATENT DOCUMENTS 6,867,658 B1 3/2005 Sibrai et al.
8,081,039 B1 12/2011 Venca et al.
(Continued)

FOREIGN PATENT DOCUMENTS

CN 101295962 A 10/2008
CN 101834561 A 9/2010
(Continued)

OTHER PUBLICATIONS

Foreign Communication From a Counterpart Application, European Application No. 16908505.7, Extended European Search Report dated Mar. 27, 2019, 10 pages.
(Continued)

*Primary Examiner* — Eugene Yun
(74) *Attorney, Agent, or Firm* — Conley Rose, P.C.

(57) ABSTRACT

An oscillator, including a resonance circuit, a cross coupled current source circuit, and a positive feedback circuit coupled between the current source circuit and the resonance circuit, where the resonance circuit is configured to generate a differential oscillation signal having a first oscillation frequency, the positive feedback circuit is configured to receive the differential oscillation signal, and amplify a gain of the differential oscillation signal to obtain a differential output oscillation signal, and the current source circuit is configured to provide an adjustable bias current for the resonance circuit and the positive feedback circuit. Since, the current source circuit provides the adjustable bias current for the positive feedback circuit and the resonance circuit, and forms a transconductance boosted (Gm-boosted) structure with the positive feedback circuit, the positive feedback circuit can amplify the gain of the received differential oscillation signal to obtain the differential output oscillation signal.

20 Claims, 11 Drawing Sheets

(51) Int. Cl.
*H04B 5/00* (2006.01)
*H04W 88/08* (2009.01)

(52) U.S. Cl.
CPC .......... H03L 7/099 (2013.01); H04B 5/0075 (2013.01); *H03B 2200/004* (2013.01); *H03B 2200/005* (2013.01); *H03B 2200/0008* (2013.01); *H03B 2200/009* (2013.01); *H03B 2200/0058* (2013.01); *H03B 2200/0062* (2013.01); *H04W 88/08* (2013.01)

(58) Field of Classification Search
CPC ...... H03B 2200/004; H03B 2200/0008; H03B 5/1212; H03B 2200/009; H03B 5/1265; H03B 7/06; H03B 5/1243; H03B 5/1215; H04B 5/0075; H03L 7/099; H04W 88/08
USPC .................................................... 455/343.1
See application file for complete search history.

(56) References Cited

U.S. PATENT DOCUMENTS

| | | | |
|---|---|---|---|
| 8,159,308 | B1 | 4/2012 | Sutardja |
| 8,217,728 | B2 | 7/2012 | Lee et al. |
| 2005/0275469 | A1 | 12/2005 | Metaxakis |
| 2008/0174379 | A1 | 7/2008 | Chen |
| 2008/0266007 | A1 | 10/2008 | Tsai |
| 2009/0128245 | A1 | 5/2009 | Aspemyr et al. |
| 2009/0134944 | A1 | 5/2009 | Lee et al. |
| 2011/0043293 | A1 | 2/2011 | Knoblinger et al. |
| 2012/0249250 | A1 | 10/2012 | Cheng et al. |
| 2014/0077890 | A1 | 3/2014 | Babaie et al. |
| 2014/0320215 | A1 | 10/2014 | Staszewski et al. |
| 2016/0036382 | A1 | 2/2016 | Chakraborty |
| 2016/0099691 | A1* | 4/2016 | Babaie ................ H01F 27/2823 330/251 |

FOREIGN PATENT DOCUMENTS

| | | |
|---|---|---|
| CN | 102118162 A | 7/2011 |
| CN | 102904527 A | 1/2013 |
| CN | 104242924 A | 12/2014 |
| CN | 104270100 A | 1/2015 |
| EP | 2063634 A1 | 5/2009 |
| JP | 2011244086 A | 12/2011 |

OTHER PUBLICATIONS

Machine Translation and Abstract of Chinese Publication No. CN101834561, Sep. 15, 2010, 15 pages.
Machine Translation and Abstract of Chinese Publication No. CN102118162, Jul. 6, 2011, 14 pages.
Machine Translation and Abstract of Chinese Publication No. CN102904527, Jan. 30, 2013, 23 pages.
Machine Translation and Abstract of Chinese Publication No. CN104242924, Dec. 24, 2014, 19 pages.
Machine Translation and Abstract of Chinese Publication No. CN104270100, Jan. 7, 2015, 15 pages.
Foreign Communication From a Counterpart Application, PCT Application No. PCT/CN2016/090223, English Translation of International Search Report dated Apr. 19, 2017, 3 pages.
Hou, J., et al, "A 5 GHz Differential Colpitts CMOS VCO Using the Bottom PMOS Cross-Coupled Current Source." IEEE Microwave and Wireless Components Letters, vol. 19, No. 6, Jun. 2009, pp. 401-403.
Zhuo, W., et al, "A Capacitor Cross-Coupled Common-Gate Low-Noise Amplifier," IEEE Transactions on Circuits and Systems—II: Express Briefs, vol. 52, No. 12, Dec. 2005, pp. 875-879.
Cheng, K., et al, "A Current-Switching and gm-Enhanced Colpitts Quadrature VCO," IEEE Microwave and Wireless Components Letters, vol. 23, No. 3, Mar. 2013, pp. 143-145.
Foreign Communication From a Counterpart Application, Chinese Application No. 201680002584.3, Chinese Office Action dated Nov. 28, 2019, 9 pages.
Machine Translation and Abstract of Japanese Publication No. JP2011244086, Dec. 1, 2011, 30 pages.
Foreign Communication From a Counterpart Application, Korean Application No. 10-2018-7035111, Korean Office Action dated Feb. 10, 2020, 6 pages.
Foreign Communication From a Counterpart Application, Korean Application No. 10-2018-7035111, English Translation of Korean Office Action dated Feb. 24, 2020, 5 pages.

\* cited by examiner

OSCILLATOR

CROSS-REFERENCE TO RELATED APPLICATIONS

This application is a continuation of International Patent Application No. PCT/CN2016/090223 filed on Jul. 15, 2016, which is hereby incorporated by reference in its entirety.

TECHNICAL FIELD

Embodiments of the present disclosure relate to the field of electronic technologies, and in particular, to an oscillator.

BACKGROUND

As one of important units of electronic systems, oscillators are widely applied. Generally, power consumption and phase noise of an oscillator are main parameters for measuring performance of the oscillator, and oscillators having low power consumption and low phase noise have been a long-term research subject.

In other approaches, a cross coupled negative resistance oscillator (oscillator hereinafter) is provided. As shown in FIG. 1A, the oscillator includes a resonance unit 10 and a cross-complementing active unit 11 connected to the resonance unit 10. The resonance unit 10 is configured to generate oscillation signals having a particular oscillation frequency. The cross-complementing active unit 11 is configured to compensate for energy consumption of the resonance unit 10 such that the resonance unit 10 can output stable oscillation signals.

A calculation formula of phase noise of the oscillator is:

$$L\{\Delta\omega\} = \frac{i_n^2/\Delta f}{2q_{max}^2} \times \frac{\Gamma_{eff,rms}^2}{\Delta\omega^2}, \quad (1)$$

where $\Delta\omega$ is a frequency offset of a carrier processed or generated by the oscillator, $i_n^2/\Delta f$ is power spectral density of current noise, $\Gamma_{eff,rms}^2$ is a root mean square value of a $\Gamma_{eff}(\omega t)$ function, and $q_{max}$ is a maximum charge amount of a current noise source, and:

$$\Gamma_{eff}(\omega t) = \Gamma(\omega t) \times \alpha(\omega t) \quad (2),$$

where $\Gamma(\omega t)$ is an impulse sensitivity function (ISF), $\alpha(\omega t)$ is noise-modulating function (NMF) in which a phase changes over time, and the ISF describes an offset degree of a phase of an output signal that is caused by injecting a unit pulse current into a node at a time point. Because a waveform of an oscillation signal generated by the cross coupled negative resistance oscillator shown in FIG. 1A is a sine wave, an $ISF_{eff}$ (that is, $\Gamma_{eff}(\omega t)$ in the formula (2)) function curve, as shown in FIG. 1B, of the cross coupled negative resistance oscillator is obtained by injecting a unit pulse current into the cross coupled negative resistance oscillator at different time points and then performing simulation. It can be seen from FIG. 1B that a value of the $ISF_{eff}$ is 0 only in a time length of $\pi/2$ (that is, from $3\pi/2$ to $2\pi$) within an oscillation period ($2\pi$), and is not 0 in the rest time length of $3\pi/2$ (that is, from 0 to $3\pi/2$). It can be known with reference to the formula (1) and the formula (2) that within the oscillation period, the phase noise of the cross coupled negative resistance oscillator is relatively high. Consequently, phase noise performance of the cross coupled negative resistance oscillator is relatively poor.

SUMMARY

Embodiments of the present disclosure provide an oscillator in order in order to meet a performance requirement of low power consumption.

According to a first aspect, an embodiment of the present disclosure provides an oscillator having low power consumption and low phase noise, including a resonance unit, a cross coupled current source unit, and a positive feedback unit coupled between the current source unit and the resonance unit, where the resonance unit is configured to generate a differential oscillation signal having a first oscillation frequency, the positive feedback unit is configured to receive the differential oscillation signal, and amplify a gain of the differential oscillation signal to obtain a differential output oscillation signal, and the current source unit is configured to provide an adjustable bias current for the resonance unit and the positive feedback unit.

This embodiment of the present disclosure provides an oscillator. Because the current source unit can provide the adjustable bias current for the positive feedback unit and the resonance unit, and forms a transconductance boosted (Gm-boosted) structure with the positive feedback unit, the positive feedback unit can amplify the gain of the received differential oscillation signal, to obtain the differential output oscillation signal. Therefore, under a condition that the oscillator is ensured to be started up normally, the power consumption of the oscillator provided in this embodiment of the present disclosure can be lowered by reducing the bias current.

With reference to the first aspect, in a first possible implementation of the first aspect, the resonance unit is further configured to output the differential oscillation signal to the current source unit through the positive feedback unit, and the current source unit is further configured to adjust the bias current by controlling magnitude of a bias voltage and according to the differential oscillation signal output by the resonance unit, to adjust amplitude of the differential output oscillation signal.

With reference to the first aspect and the first possible implementation of the first aspect, in a second possible implementation of the first aspect, the positive feedback unit includes a first metal-oxide-semiconductor (MOS) transistor, a second MOS transistor, a first capacitor, a second capacitor, a third capacitor, and a fourth capacitor, where a first terminal of the first MOS transistor, as a first output node, is separately connected to the resonance unit and one end of the first capacitor, a second terminal of the first MOS transistor is separately connected to the other end of the first capacitor and one end of the third capacitor, both a gate of the first MOS transistor and a gate of the second MOS transistor are connected to a first constant voltage source, a first terminal of the second MOS transistor is separately connected to the resonance unit and one end of the second capacitor, a second terminal of the second MOS transistor, as a second output node, is separately connected to the other end of the second capacitor and one end of the fourth capacitor, the other end of the fourth capacitor is connected to the other end of the third capacitor, both one end of the third capacitor and one end of the fourth capacitor are connected to the current source unit, a positive differential signal output end is disposed between one end of the third capacitor and a third output node of the current source unit, and a negative differential signal output end is disposed between one end of the fourth capacitor and a fourth output node of the current source unit. In this way, impact of an output load on a positive differential oscillation signal and a negative differential oscillation signal can be reduced.

With reference to the second possible implementation of the first aspect, in a third possible implementation of the first aspect, the first constant voltage source is a first power source.

With reference to any one of the first aspect to the third possible implementation of the first aspect, in a fourth possible implementation of the first aspect, the resonance unit includes a first inductor, a second inductor, and a switched capacitor array, where one end of the first inductor is connected to one end of the second inductor, the other end of the first inductor is separately connected to one end of the switched capacitor array and a first output node of the positive feedback unit, the other end of the second inductor is separately connected to the other end of the switched capacitor array and a second output node of the positive feedback unit, and one end of the first inductor and one end of the second inductor are connected to the first constant voltage node. In this way, a frequency of the oscillator may be changed by turning on or turning off a switch in the switched capacitor array.

With reference to the fourth possible implementation of the first aspect, in a fifth possible implementation of the first aspect, the current source unit includes a third MOS transistor, a fourth MOS transistor, a fifth capacitor, a sixth capacitor, a first resistor, and a second resistor, where a gate of the third MOS transistor is separately connected to one end of the sixth capacitor and one end of the first resistor, and a drain of the third MOS transistor, as the third output node, is separately connected to one end of the fifth capacitor and one end of the third capacitor, a gate of the fourth MOS transistor is separately connected to the other end of the fifth capacitor and one end of the second resistor, and a drain of the fourth MOS transistor, as the fourth output node, is separately connected to the other end of the sixth capacitor and one end of the fourth capacitor, both the other end of the first resistor and the other end of the second resistor are connected to an adjustable power source, the adjustable power source is configured to provide the adjustable bias voltage for the current source unit, and the current source unit is further configured to provide the adjustable bias current for the resonance unit and the positive feedback unit through the adjustable power source, and a source of the third MOS transistor and a source of the fourth MOS transistor are connected to a second constant voltage node. By controlling a size of the adjustable power source, the third MOS transistor and the fourth MOS transistor in the oscillator may be adjusted to be in different working modes such that a time for which the first MOS transistor, the second MOS transistor, the third MOS transistor, and the fourth MOS transistor in the oscillator are turned on can be effectively reduced. If a start-up gain in the oscillator is invariable, because the time for which the first MOS transistor, the second MOS transistor, the third MOS transistor, and the fourth MOS transistor are turned on is reduced, a current value within an oscillation period is reduced. Because power consumption is proportional to a current, the power consumption of the oscillator is reduced.

With reference to the fifth possible implementation of the first aspect, in a sixth possible implementation of the first aspect, when the first MOS transistor and the second MOS transistor are negative channel MOS (NMOS) transistors, and the third MOS transistor and the fourth MOS transistor are NMOS transistors, both the first terminal of the first MOS transistor and the first terminal of the second MOS transistor are drains, and both the second terminal of the first MOS transistor and the second terminal of the second MOS transistor are sources, and the first constant voltage node is the first power source, and the second constant voltage node is the ground.

With reference to the fifth possible implementation of the first aspect, in a seventh possible implementation of the first aspect, when the first MOS transistor and the second MOS transistor are positive channel MOS (PMOS) transistors, and the third MOS transistor and the fourth MOS transistor are PMOS transistors, both the first terminal of the first MOS transistor and the first terminal of the second MOS transistor are drains, and both the second terminal of the first MOS transistor and the second terminal of the second MOS transistor are sources, and the first constant voltage node is the ground, and the second constant voltage node is the first power source.

With reference to the fifth possible implementation of the first aspect, in an eighth possible implementation of the first aspect, when the first MOS transistor and the second MOS transistor are PMOS transistors, and the third MOS transistor and the fourth MOS transistor are NMOS transistors, both the first terminal of the first MOS transistor and the first terminal of the second MOS transistor are sources, and both the second terminal of the first MOS transistor and the second terminal of the second MOS transistor are drains, and the first constant voltage node is the first power source, and the second constant voltage node is the ground.

With reference to the fifth possible implementation of the first aspect, in a ninth possible implementation of the first aspect, when the first MOS transistor and the second MOS transistor are NMOS transistors, and the third MOS transistor and the fourth MOS transistor are PMOS transistors, both the first terminal of the first MOS transistor and the first terminal of the second MOS transistor are sources, and both the second terminal of the first MOS transistor and the second terminal of the second MOS transistor are drains, and the first constant voltage node is the ground, and the second constant voltage node is the first power source.

With reference to any one of the fourth possible implementation of the first aspect to the ninth possible implementation of the first aspect, in a tenth possible implementation of the first aspect, the switched capacitor array includes at least one switched capacitor branch, and any one of the switched capacitor branches includes a seventh capacitor, a switch, and an eighth capacitor, where one end of the seventh capacitor is connected to the other end of the first inductor and the first output node of the positive feedback unit, and the other end of the eighth capacitor is connected to the second output node of the positive feedback unit and the other end of the second inductor.

With reference to the tenth possible implementation of the first aspect, in an eleventh possible implementation of the first aspect, the seventh capacitor and the eighth capacitor are adjustable capacitors.

According to a second aspect, an embodiment of the present disclosure provides a terminal, where the terminal includes at least a short-range communications apparatus and the oscillator according to any one of the first aspect to the eleventh possible implementation of the first aspect, and the oscillator is configured to provide a local carrier signal for the short-range communications apparatus.

According to a third aspect, an embodiment of the present disclosure provides a base station, where the base station includes at least a transceiver and a phase-locked loop circuit, where the phase-locked loop circuit includes the oscillator according to any one of the first aspect to the eleventh possible implementation of the first aspect, and the oscillator is configured to provide a local carrier signal for the transceiver.

BRIEF DESCRIPTION OF DRAWINGS

To describe the technical solutions in some of the embodiments of the present disclosure more clearly, the following briefly describes the accompanying drawings describing some of the embodiments. The accompanying drawings in the following description show merely some embodiments of the present disclosure, and persons of ordinary skill in the art may still derive other drawings from these accompanying drawings without creative efforts.

DESCRIPTION OF EMBODIMENTS

The following describes the technical solutions in some of the embodiments of the present disclosure in detail with reference to the accompanying drawings in the embodiments of the present disclosure. The described embodiments are merely some but not all of the embodiments of the present disclosure.

It should be noted that, the embodiments and the accompanying drawings of the present disclosure are merely examples. Each MOS transistor in any one of the embodiments or the accompanying drawings may be a separate MOS transistor satisfying a required start-up gain or a required turned-on current, or may be a MOS transistor combination that needs to satisfy a required start-up gain or a required turned-on current and that is formed by multiple MOS transistors that are connected in parallel. That is, a sum of start-up gains corresponding to the multiple MOS transistors is greater than or equal to the required start-up gain. Each capacitor in the embodiments of the present disclosure may be a capacitor satisfying a required capacitance value, or may be a capacitor combination that satisfies a required capacitance value and that is formed by multiple capacitors that are connected in parallel or in series. That is, a capacitance value corresponding to the multiple capacitors that are connected in parallel or in series is equal to the required capacitance value. Each inductor in the embodiments of the present disclosure may be an inductor satisfying a required inductance value, or may be an inductor combination that satisfies a required inductance value and that is formed by multiple inductors that are connected in series or in parallel.

Figure 2:
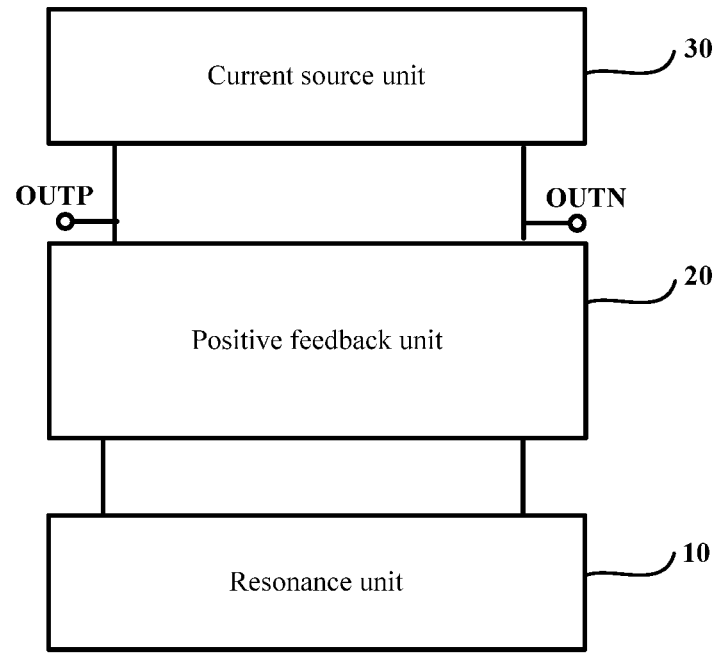
FIG. 2 is a first schematic structural diagram of an oscillator according to an embodiment of the present disclosure.

As shown in FIG. 2, an embodiment of the present disclosure provides an oscillator, including a resonance unit 10, a cross coupled current source unit 30, and a positive feedback unit 20 coupled between the current source unit 30 and the resonance unit 10. The resonance unit 10 is configured to generate a differential oscillation signal having a first oscillation frequency. The positive feedback unit 20 is configured to receive the differential oscillation signal, and amplify a gain of the differential oscillation signal to obtain a differential output oscillation signal. The current source unit 30 is configured to provide an adjustable bias current for the resonance unit 10 and the positive feedback unit 20. Differential oscillation signal output ends (that is, a positive differential oscillation signal output end, OUTP and a negative differential oscillation signal output end, OUTN shown in FIG. 2) are disposed between the positive feedback unit 20 and the current source unit 30, and are configured to output a differential output oscillation signal. The OUTP is configured to connect to a load, and output a positive differential output oscillation signal to the load. The OUTN is configured to output a negative differential output oscillation signal to the load. Further, the current source unit 30 provides the adjustable bias current for the resonance unit 10 through the positive feedback unit 20.

This embodiment of the present disclosure provides an oscillator. Because the current source unit 30 can provide the adjustable bias current for the positive feedback unit 20 and the resonance unit 10, and forms a Gm-boosted structure with the positive feedback unit 20, the positive feedback unit 20 can amplify the gain of the received differential oscillation signal to obtain the differential output oscillation signal. Therefore, under a condition that the oscillator is ensured to be started up normally, power consumption of the oscillator provided in this embodiment of the present disclosure can be lowered by reducing the bias current.

Optionally, the resonance unit 10 is further configured to output the differential oscillation signal to the current source unit 30 through the positive feedback unit 20. The current source unit 30 is further configured to adjust the bias current by controlling magnitude of a bias voltage and according to the differential oscillation signal output by the resonance unit 10 to adjust amplitude of the differential output oscillation signal.

Because amplitude of the differential oscillation signal output by the resonance unit 10 in the oscillator is equal to a product of the bias current provided by the current source unit 30 in the oscillator for the resonance unit 10 and the positive feedback unit 20 and resistance of the oscillator (that is, equivalent impedance of all components in the oscillator), and a resistance value in the oscillator is almost invariable, the amplitude of the differential oscillation signal is proportional to the bias current provided by the current source unit 30. Further, because the magnitude of the bias current is proportional to the magnitude of the bias voltage, in this embodiment of the present disclosure, the magnitude of the bias current in the oscillator may be changed by adjusting the magnitude of the bias voltage.

Further, if the amplitude of the differential oscillation signal output by the oscillator (the resonance unit 10 in the oscillator) is excessively high, the magnitude of the bias voltage may be controlled to be lower to reduce the bias current such that the amplitude of the differential oscillation signal output by the oscillator is reduced. If the amplitude of the differential oscillation signal output by the oscillator is excessively low, the bias voltage may be controlled to be higher, to increase the bias current such that the amplitude of the differential oscillation signal output by the oscillator is increased, and finally the amplitude of the differential oscillation signal output by the oscillator are stable.

Figure 3:
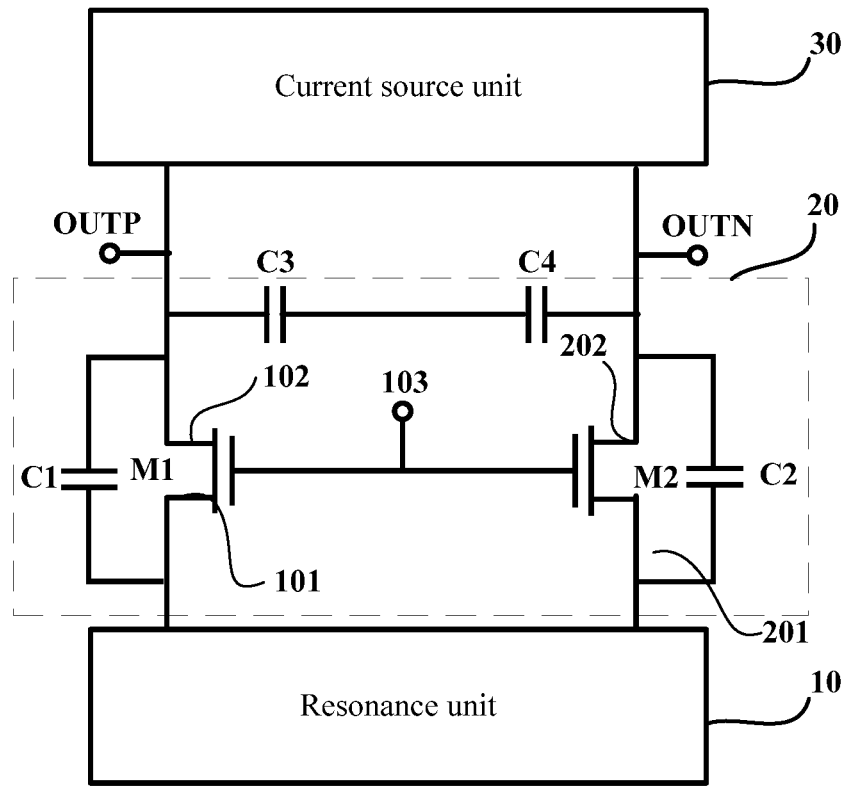
FIG. 3 is a second schematic structural diagram of an oscillator according to an embodiment of the present disclosure.

As shown in FIG. 3, the positive feedback unit 20 provided in this embodiment of the present disclosure includes a first MOS transistor M1, a second MOS transistor M2, a first capacitor C1, a second capacitor C2, a third capacitor C3, and a fourth capacitor C4. A first terminal 101 of the first MOS transistor M1, as a first output node, is separately connected to a first end of the resonance unit 10 and one end of the first capacitor C1. A second terminal 102 of the first MOS transistor is separately connected to the other end of the first capacitor C1 and one end of the third capacitor C3. Both a gate of the first MOS transistor M1 and a gate of the second MOS transistor M2 are connected to a first constant voltage source 103. A first terminal 201 of the second MOS transistor M2 is separately connected to a second end of the resonance unit 10 and one end of the second capacitor C2. A second terminal 202 of the second MOS transistor M2, as a second output node, is separately connected to the other end of the second capacitor C2 and one end of the fourth capacitor C4. The other end of the fourth capacitor C4 is connected to the other end of the third capacitor C3. Both one end of the third capacitor C3 and one end of the fourth capacitor C4 are connected to the current source unit 30. A positive differential signal output end OUTP is disposed between one end of the third capacitor C3 and a third output node of the current source unit 30, and a negative differential signal output end OUTN is disposed between one end of the fourth capacitor C4 and a fourth output node of the current source unit 30.

In this embodiment of the present disclosure, a start-up gain is provided by the first MOS transistor M1 and the second MOS transistor M2 in the positive feedback unit 20 for the oscillator when the oscillator oscillates. A positive alternating current feedback is formed by the first capacitor C1, the first MOS transistor M1, the third capacitor C3, the second capacitor C2, the second MOS transistor M2 and the fourth capacitor C4, to amplify noise of a component in the oscillator such that the oscillator maintains an oscillation state and outputs the differential output oscillation signal through the positive differential signal output end OUTP and the negative differential signal output end OUTN. In addition, because the gate of the first MOS transistor M1 and the gate the second MOS transistor M2 are connected to the first constant voltage source 103, the first terminal 101 and the second terminal 102 of the first MOS transistor M1 are respectively connected to one end and the other end of the first capacitor C1, and the first terminal 201 and the second terminal 202 of the second MOS transistor are respectively connected to one end and the other end of the second capacitor C2, the first MOS transistor M1 and the second MOS transistor M2 can be turned on only when a voltage of the differential output oscillation signal is less than a voltage of the first constant voltage source 103. In this way, a time for which the first MOS transistor M1 and the second MOS transistor M2 are turned on within an oscillation period is reduced, that is, a time for which the current source unit 30 and the positive feedback unit 20 inject current noise into the resonance unit 10 within an oscillation period is reduced. Therefore, compared with the other approaches, phase noise (formed by converting the current noise) within an oscillation period in the oscillator is relatively low.

The first constant voltage source 103 may be a first power source, or may be another constant voltage source. This is not limited in this embodiment of the present disclosure, and selection may be performed according to a requirement.

Further, in the oscillator provided in this embodiment of the present disclosure, a phase shift by 90 degrees exists, using a phase shift between the first capacitor C1 and the second capacitor C2, between a voltage waveform and a current waveform of the differential oscillation signal such that within an oscillation period, a maximum value of an NMF corresponds to a minimum value of an ISF. According to a formula $\Gamma_{eff}(\omega t)=\Gamma(\omega t)\times\alpha(\omega t)$, where $\Gamma_{eff}(\omega t)$ is an $ISF_{eff}$, $\Gamma(\omega t)$ is an ISF, and $\alpha(\omega t)$ is an NMF in which a phase changes over time, a value of the $ISF_{eff}$ within an oscillation period may be reduced such that the phase noise of the oscillator provided in this embodiment of the present disclosure is further reduced.

Further, the current source unit 30 can provide the adjustable bias current for the positive feedback unit 20 and the resonance unit 10, and forms a Gm-boosted structure with the positive feedback unit 20. Therefore, under a condition that the oscillator is ensured to be started up normally, the power consumption of the oscillator provided in this embodiment of the present disclosure can be lowered by reducing the bias current.

Figure 4A:
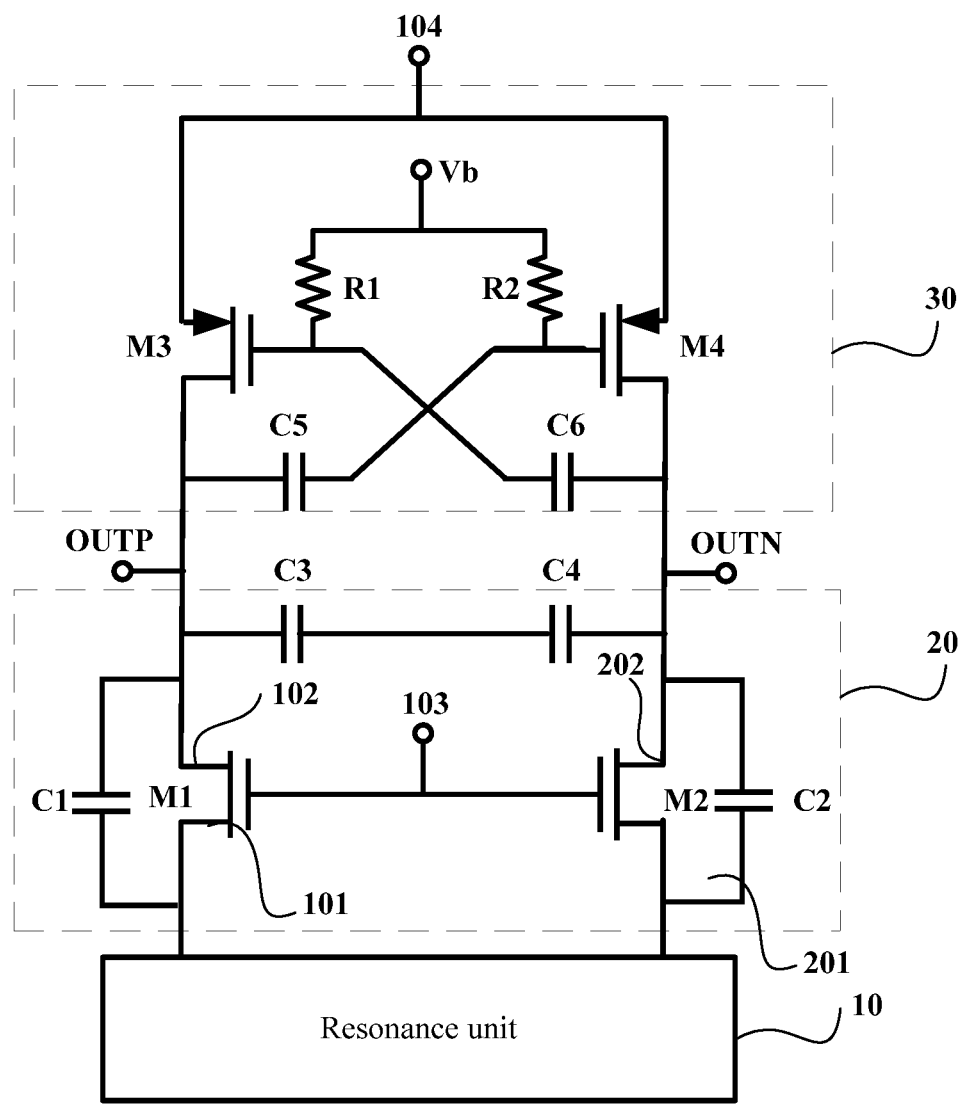
FIG. 4A is a third schematic structural diagram of an oscillator according to an embodiment of the present disclosure.

Optionally, with reference to FIG. 3, as shown in FIG. 4A, the current source unit 30 in this embodiment of the present disclosure includes a third MOS transistor M3, a fourth MOS transistor M4, a fifth capacitor C5, a sixth capacitor C6, a first resistor R1, and a second resistor R2. A gate of the third MOS transistor M3 is separately connected to one end of the sixth capacitor C6 and one end of the first resistor R1. A drain of the third MOS transistor M3, as the third output node, is separately connected to one end of the fifth capacitor C5 and one end of the third capacitor C3. A gate of the fourth MOS transistor M4 is separately connected to the other end of the fifth capacitor C5 and one end of the second resistor R2. A drain of the fourth MOS transistor, as the fourth output node, is separately connected to the other end of the sixth capacitor C6 and one end of the fourth capacitor C4. Both the other end of the first resistor R1 and the other end of the second resistor R2 are connected to an adjustable power source Vb. The adjustable power source Vb is configured to provide the adjustable bias voltage for the current source unit 30. The current source unit 30 is further configured to provide the adjustable bias current for the resonance unit 10 and the positive feedback unit 20 through the adjustable power source Vb. A source of the third MOS transistor M3 and a source of the fourth MOS transistor M4 are connected to a second constant voltage node 104. The third MOS transistor M3 and the fourth MOS transistor M4 are PMOS transistors. A working principle of the current source unit 30 is similar to that of a Colpitts oscillator.

Alternatively, if the third MOS transistor M3 and the fourth MOS transistor M4 are NMOS transistors, both the source of the third MOS transistor and the source of the fourth MOS transistor are grounded. In this case, the first MOS transistor M1 and the second MOS transistor M2 may be NMOS transistors, or may be PMOS transistors.

Alternatively, if the third MOS transistor M3 and the fourth MOS transistor M4 are PMOS transistors, both the source of the third MOS transistor and the source of the fourth MOS transistor are connected to the first power source. In this case, the first MOS transistor M1 and the second MOS transistor M2 may be PMOS transistors, or may be NMOS transistor.

FIG. 4A shows an oscillator. The oscillator provided in this embodiment of the present disclosure includes four MOS transistors, that is, the first MOS transistor M1, the second MOS transistor M2, the third MOS transistor M3, and the fourth MOS transistor M4. The four MOS transistors jointly form a Gm-boosted structure. In one aspect, a higher start-up gain may be obtained with same power consumption. In another aspect, relatively low power consumption is obtained with a same start-up gain. In the other approaches (for example, the cross coupled negative resistance oscillator shown in FIG. 1A), there are only two MOS transistors, that is, M1 and M2 shown in FIG. 1A. When the oscillator shown in FIG. 4A and the cross coupled negative resistance oscillator shown in FIG. 1A have a same start-up gain, the cross coupled negative resistance oscillator shown in FIG. 1A needs to consume more currents to satisfy the start-up gain. Because power consumption of an oscillator is proportional to a current, power consumption of the oscillator shown in FIG. 4A in this embodiment of the present disclosure is lower than power consumption of the oscillator in the other approaches.

In one aspect, in the oscillator shown in FIG. 4A, the fifth capacitor C5 and the sixth capacitor C6 are mainly configured to isolate a direct-current voltage of the gate of the third MOS transistor M3 and a direct-current voltage of the gate of the fourth MOS transistor M4 from a direct-current voltage output by the positive feedback unit 20 such that the direct-current voltage output by the positive feedback unit 20 is prevented from affecting the third MOS transistor M3 and the fourth MOS transistor M4.

In another aspect, in the oscillator shown in FIG. 4A, the third MOS transistor M3 and the fourth MOS transistor M4 may be adjusted to be in different working modes by controlling magnitude of a voltage output by the adjustable power source Vb. For example, working modes of the third MOS transistor M3 and the fourth MOS transistor M4 may be adjusted from current working modes to a first working mode such that the current source unit 30 can provide the adjustable bias current for the resonance unit 10 and the positive feedback unit 20.

In this embodiment of the present disclosure, the first working mode includes but is not limited to a class A working mode, a class B working mode, a class C working mode, a class D working mode, and a class E working mode. That is, in the oscillator provided in this embodiment of the present disclosure, in addition to the foregoing five classes of working modes, the first working mode may further be another working mode satisfying a use requirement, for example, a class AB working mode.

For example, when the first working mode in this embodiment of the present disclosure is the class A working mode, that is, the third MOS transistor M3 and the fourth MOS transistor M4 in the current source unit 30 work in the class A working mode, within an oscillation period, both the third MOS transistor M3 and the fourth MOS transistor M4 in the current source unit 30 are turned on. However, because the gate of the first MOS transistor is connected to the first constant voltage source 103, and the gate of the second MOS transistor is connected to the first constant voltage source 103, where the first constant voltage source is an adjustable power source, the first MOS transistor M1 and the second MOS transistor M2 can be turned on only when an absolute value of a gate-source voltage difference of the first MOS transistor M1 and an absolute value of a gate-source voltage difference of the second MOS transistor M2 are respectively greater than a threshold voltage of the first MOS transistor M1 and a threshold voltage of the second MOS transistor M2 (that is, an absolute value of a start-up voltage UGS (th)), that is, the first MOS transistor M1 and the second MOS transistor M2 can be turned on only when amplitude of a positive differential output oscillation signal output by the positive feedback unit and the absolute value of the gate-source voltage difference of the first MOS transistor M1 are greater than the threshold voltage of the first MOS transistor M1, and amplitude of a negative differential output oscillation signal output by the positive feedback unit and the absolute value of the gate-source voltage difference of the second MOS transistor M2 are greater than the threshold voltage of the second MOS transistor M2. Therefore, in this embodiment of the present disclosure, within an oscillation period, when both the third MOS transistor M3 and the fourth MOS transistor M4 are turned on, working statuses of the first MOS transistor M1 and the second MOS transistor M2 are the class C working mode or a working mode deeper than the class C working mode (for example, the class D working mode or the class E working mode).

When the first working mode in this embodiment of the present disclosure is the class B working mode, that is, when the third MOS transistor M3 and the fourth MOS transistor M4 in the current source unit 30 work in the class B working mode, within the first ½ of an oscillation period, the third MOS transistor M3 is turned on. Because the source of the second MOS transistor is connected to the gate of the third MOS transistor, when the absolute value of the gate-source voltage difference of the second MOS transistor M2 is greater than the threshold voltage of the second MOS transistor M2, the second MOS transistor M2 is turned on. When the absolute value of the gate-source voltage difference of the second MOS transistor M2 is less than the threshold voltage of the second MOS transistor M2, the second MOS transistor M2 is turned off, the fourth MOS transistor M4 is turned off, and the first MOS transistor M1 is turned off. Within the second ½ of the oscillation period, the third MOS transistor M3 is turned off, the second MOS transistor M2 is turned off, and the fourth MOS transistor M4 is turned on. When the absolute value of the gate-source voltage difference of the first MOS transistor M1 is greater than the threshold voltage of the first MOS transistor M1, the first MOS transistor M1 is turned on. Alternatively, within the first ½ of an oscillation period, the fourth MOS transistor M4 is turned on. When the gate-source voltage difference of the first MOS transistor M1 is greater than the threshold voltage of the first MOS transistor M1, the first MOS transistor M1 is turned on, the third MOS transistor M3 is turned off, and the second MOS transistor M2 is turned off. Within the second ½ of the oscillation period, the fourth MOS transistor M4 is turned off, the first MOS transistor M1 is turned off, and the third MOS transistor M3 is turned on. When the absolute value of the gate-source voltage difference of the second MOS transistor M2 is greater than the threshold voltage of the second MOS transistor M2, the second MOS transistor M2 is turned on.

When the first working mode in this embodiment of the present disclosure is the class C working mode, that is, when the third MOS transistor M3 and the fourth MOS transistor M4 in the current source unit 30 work in the class C working mode, within the first ⅓ of an oscillation period, the third MOS transistor M3 is turned on. Because the source and the second MOS transistor M2 is connected to the gate of the third MOS transistor M3, when the absolute value of the gate-source voltage difference of the second MOS transistor is greater than the threshold voltage of the second MOS transistor M2, the second MOS transistor M2 is turned on, and the fourth MOS transistor M4 is turned off. Because the source of the first MOS transistor M1 is connected to the gate of the fourth MOS transistor M4, the first MOS transistor M1 is turned off. Within the last ⅔ of the oscillation period, the third MOS transistor M3 is turned off. Because the source of the second MOS transistor M2 is connected to the gate of the third MOS transistor M3, when the third MOS transistor M3 is turned off, the second MOS is turned off, and the fourth MOS transistor M4 is turned on. Because the source of the second MOS transistor is connected to the gate of the fourth MOS transistor, when the absolute value of the gate-source voltage difference of the first MOS transistor M1 is greater than the threshold voltage of the first MOS transistor M1, the first MOS transistor M1 is turned on. Alternatively, within the first ⅓ of an oscillation period, the fourth MOS transistor M4 is turned on. When the absolute value of the gate-source voltage difference of the first MOS transistor M1 is greater than the threshold voltage of the first MOS transistor M1, the first MOS transistor M1 is turned on, the third MOS transistor M3 is turned off, and the second MOS transistor M2 is turned off. Within the last ⅔ of the oscillation period, the fourth MOS transistor M4 is turned off, the first MOS transistor M1 is turned off, and the third MOS transistor M3 is turned on. When the absolute value of the gate-source voltage difference of the second MOS transistor M2 is greater than the threshold voltage, the second MOS transistor M2 is turned on.

When the first working mode in this embodiment of the present disclosure is the class D working mode, that is, when the third MOS transistor M3 and the fourth MOS transistor M4 in the current source unit 30 work in the class D working mode, within the first ¼ of an oscillation period, the fourth MOS transistor M4 is turned off, the first MOS transistor is turned off, and the third MOS transistor M3 is turned on. When the absolute value of the gate-source voltage difference of the second MOS transistor M2 is greater than the threshold voltage, the second MOS transistor M2 is turned on. Within the last ¾ of the oscillation period, the third MOS transistor M3 is turned off, the second MOS transistor M2 is turned off, and the fourth MOS transistor M4 is turned on. When the absolute value of the gate-source voltage difference of the first MOS transistor M1 is greater than the threshold voltage of the first MOS transistor M1, the first MOS transistor M1 is turned on. Alternatively, within the first ¼ of an oscillation period, the third MOS transistor M3 is turned off, the second MOS transistor M2 is turned on, and the fourth MOS transistor M4 is turned on. When the gate-source voltage difference of the first MOS transistor M1 is greater than the threshold voltage of the first MOS transistor M1, the first MOS transistor M1 is turned on. Within the last ¾ of the oscillation period, the fourth MOS transistor M4 is turned off, the first MOS transistor M1 is turned off, and the third MOS transistor M3 is turned on. When the absolute value of the gate-source voltage difference of the second MOS transistor M2 is greater than the threshold voltage of the second MOS transistor M2, the second MOS transistor M2 is turned on.

When the first working mode in this embodiment of the present disclosure is the class E working mode, that is, when the third MOS transistor M3 and the fourth MOS transistor M4 in the current source unit 30 work in the class E working mode, within the first ⅕ of an oscillation period, the fourth MOS transistor M4 is turned off, the first MOS transistor M1 is turned off, and the third MOS transistor M3 is turned on. When the absolute value of the gate-source voltage difference of the second MOS transistor M2 is greater than the threshold voltage of the second MOS transistor M2, the second MOS transistor M2 is turned on. Within the last ⅘ of the oscillation period, the third MOS transistor M3 is turned off, the second MOS transistor M2 is turned off, and the fourth MOS transistor M4 is turned on. When the absolute value of the gate-source voltage difference of the first MOS transistor M1 is greater than the threshold voltage of the first MOS transistor M1, the first MOS transistor M1 is turned on. Alternatively, within the first ⅕ of an oscillation period, the third MOS transistor M3 is turned off, the second MOS transistor M2 is turned off, and the fourth MOS transistor M4 is turned on. When the absolute value of the gate-source voltage difference of the first MOS transistor M1 is greater than the threshold voltage of the first MOS transistor M1, the first MOS transistor M1 is turned on. Within the last ⅘ of the oscillation period, the fourth MOS transistor M4 is turned off, the first MOS transistor M1 is turned off, and the third MOS transistor M3 is turned on. When the absolute value of the gate-source voltage difference of the second MOS transistor M2 is greater than the threshold voltage of the second MOS transistor M2, the second MOS transistor M2 is turned on.

It should be noted that, when the first working mode in this embodiment of the present disclosure is a working mode other than the foregoing described class A working mode, class B working mode, class C working mode, class D working mode and class E working mode, in this working mode, within the first $1/M$ of an oscillation period, the fourth MOS transistor M4 is turned off, the first MOS transistor M1 is turned off, and the third MOS transistor M3 is turned on. When the absolute value of the gate-source voltage difference of the second MOS transistor M2 is greater than the threshold voltage of the second MOS transistor M2, the second MOS transistor M2 is turned on. Within the last $(M-1)/M$ of the oscillation period, the third MOS transistor M3 is turned off, the second MOS transistor M2 is turned off, and the fourth MOS transistor M4 is turned on. When the absolute value of the gate-source voltage difference of the first MOS transistor M1 is greater than the threshold voltage of the first MOS transistor M1, the first MOS transistor M1 is turned on. Alternatively, within the first $1/M$ of an oscillation period, the third MOS transistor M3 is turned off, the second MOS transistor M2 is turned off, and the fourth MOS transistor M4 is turned on. When the absolute value of the gate-source voltage difference of the first MOS transistor M1 is greater than the threshold voltage of the first MOS transistor M1, the first MOS transistor M1 is turned on. Within the last $(M-1)/M$ of the oscillation period, the fourth MOS transistor M4 is turned off, the first MOS transistor M1 is turned off, and the third MOS transistor M3 is turned on. When the absolute value of the gate-source voltage difference of the second MOS transistor M2 is greater than the threshold voltage of the second MOS transistor M2, the second MOS transistor M2 is turned on.

Optionally, in a general case, when the positive feedback unit 20 works, to satisfy the Barkhausen criterion, the first MOS transistor M1 and the second MOS transistor in the positive feedback unit 20 need to have relatively high transconductance to satisfy a start-up gain requirement of an oscillator circuit. In this way, the first MOS transistor M1 and the second MOS transistor M2 need to consume more currents, resulting in relatively high power consumption of the oscillator. In this embodiment of the present disclosure, to reduce the power consumption of the oscillator provided in this embodiment of the present disclosure, the magnitude of the bias voltage Vb may be adjusted to set the working modes of the third MOS transistor and the fourth MOS transistor to the class C working mode or working mode deeper than the class C working mode (that is, a time for which the third MOS transistor and the fourth MOS transistor are turned on is less than a time for which the third MOS transistor and the fourth MOS transistor are turned on in the class C working mode) such that the current source unit 30 can provide the bias current and the start-up gain for the positive feedback unit 20 and the resonance unit 10 in the oscillator provided in this embodiment of the present disclosure. By means of this solution, an RMS (Root Mean Square) current can be reduced by shortening a time for which an active component is turned on such that current efficiency can be improved, and good phase noise performance is obtained when the power consumption is low.

In this embodiment of the present disclosure, the start-up gain is provided by the first MOS transistor M1 and the second MOS transistor M2 in the positive feedback unit 20 for the oscillator when the oscillator oscillates. A positive alternating current feedback is formed by the first capacitor C1, the first MOS transistor M1, the third capacitor C3, the second capacitor C2, the second MOS transistor M2 and the fourth capacitor C4, to amplify noise of a component in the oscillator such that the oscillator maintains an oscillation state and outputs the differential oscillation signal. In addition, because the gate of the first MOS transistor and the gate of the second MOS transistor are connected to the first constant voltage source, the first terminal 101 and the second terminal 102 of the first MOS transistor M1 are respectively connected to one end and the other end of the first capacitor C1, the first terminal 201 and the second terminal 202 of the second MOS transistor M2 are respectively connected to one end and the other end of the second capacitor C2, the first MOS transistor M1 and the second MOS transistor M2 can be turned on only when a voltage of the positive differential oscillation signal and the absolute value of the gate-source voltage difference of the first MOS transistor M1 are less than the threshold voltage of the first MOS transistor M1, and when a voltage of the negative differential oscillation signal and the absolute value of the gate-source voltage difference of the second MOS transistor M2 are less than the threshold voltage of the second MOS transistor M2. In this way, a time for which the first MOS transistor M1 and the second MOS transistor M2 are turned on within an oscillation period is reduced, that is, a time for which the current source unit 30 and the positive feedback unit 20 inject current noise into the resonance unit 10 within an oscillation period is reduced. Therefore, compared with the other approaches, phase noise (formed by converting the current noise) within an oscillation period in the oscillator is relatively low.

Further, in the oscillator provided in this embodiment of the present disclosure, a phase shift by 90 degrees exists, using a phase shift between the first capacitor C1 and the second capacitor C2, between a voltage waveform and a current waveform of the differential oscillation signal such that within an oscillation period, a maximum value of a NMF corresponds to a minimum value of an ISF. According to a formula $\Gamma_{\textit{eff}}(\omega t) = \Gamma(\omega t) \times \alpha(\omega t)$, where $\Gamma_{\textit{eff}}(\omega t)$ is an $\text{ISF}_{\textit{eff}}$, $\Gamma(\omega t)$ is an ISF, and $\alpha(\omega t)$ is an NMF in which a phase changes over time, a value of the $\text{ISF}_{\textit{eff}}$ within an oscillation period may be reduced such that the phase noise of the oscillator provided in this embodiment of the present disclosure is further reduced.

Figure 4B:
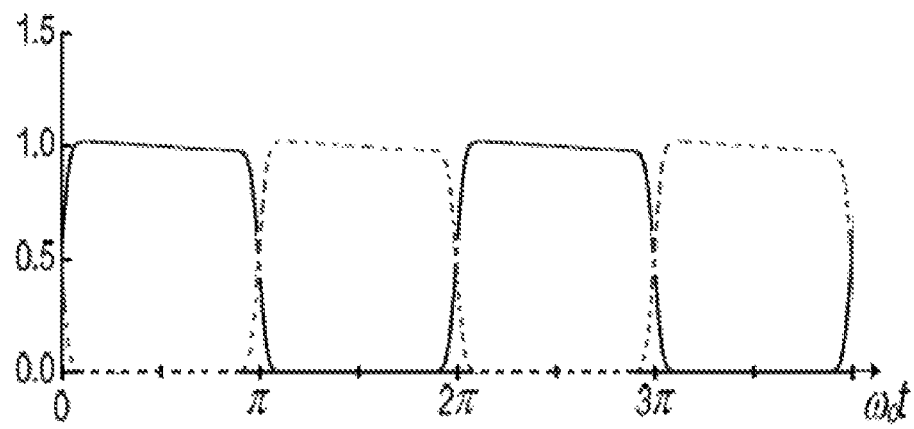
FIG. 4B is a current waveform graph of a MOS transistor in a cross coupled negative resistance oscillator in the other approaches.
Figure 4C:
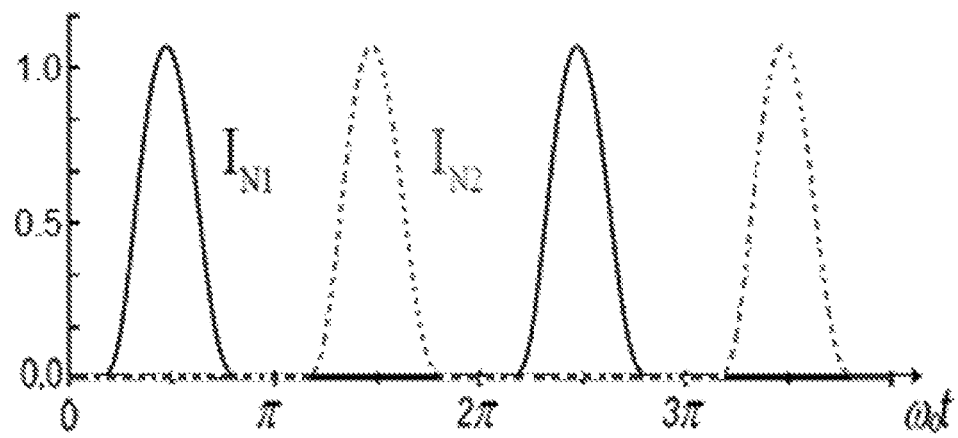
FIG. 4C is a current waveform graph of a MOS transistor in an oscillator according to an embodiment of the present disclosure.

For example, as shown in FIG. 4B and FIG. 4C, FIG. 4B is a current waveform graph of a cross coupled negative resistance oscillator in the other approaches. FIG. 4C is a current waveform graph of a bias current when the working modes of the third MOS transistor and the fourth MOS transistor are the class C working mode according to an embodiment of the present disclosure. In FIG. 4B, dashed lines represent a current waveform graph of a MOS transistor M102 in the cross coupled negative resistance oscillator in the other approaches, and solid lines represent a current waveform graph of a MOS transistor M101 in the cross coupled negative resistance oscillator in the other approaches. In FIG. 4C, dashed lines represent a current waveform graph of the bias current when the working mode of the fourth MOS transistor M4 is the class C working mode, and solid lines represent a current waveform graph of the bias current when the working mode of the third MOS transistor M3 is the class C working mode. It can be seen from FIG. 4C that within the first ⅓ of an oscillation period, the third MOS transistor M3 is turned on, and the fourth MOS transistor M4 is turned off. Within the last ⅔ of the oscillation period, the third MOS transistor M3 is turned off, and the fourth MOS transistor M4 is turned on. However, in the current waveform graph of the cross coupled negative resistance oscillator shown in FIG. 4B, within the first ½ of an oscillation period, the MOS transistor M101 in a cross-complementing active unit is turned on, and the MOS transistor M102 is turned off. Within the second ½ of the oscillation period, the MOS transistor M101 is turned off, and the MOS transistor M102 is turned on. In this way, an active component (for example, the third MOS transistor, the fourth MOS transistor, the first MOS transistor, or the second MOS transistor) in the oscillator provided in this embodiment of the present disclosure has a relatively short turned-on time within an oscillation period, and a relatively small RMS current, thereby having an advantage of reducing the power consumption.

Optionally, in this embodiment of the present disclosure, the bias voltage Vb may be less than or equal to a voltage of the first power source VCC.

Figure 5:
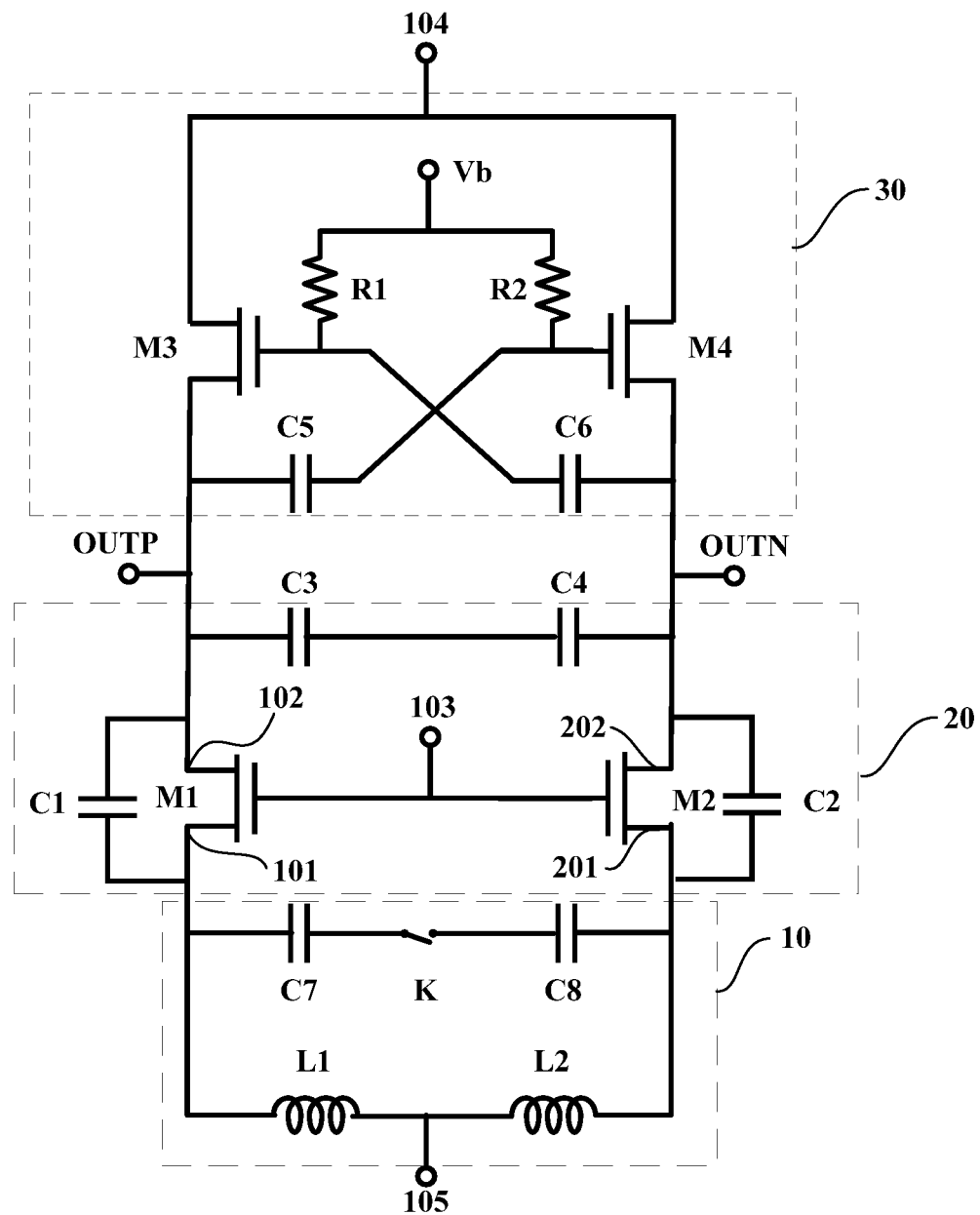
FIG. 5 is a fourth schematic structural diagram of an oscillator according to an embodiment of the present disclosure.

Optionally, in this embodiment of the present disclosure, with reference to FIG. 4A, as shown in FIG. 5, the resonance unit 10 includes a first inductor L1, a second inductor L2 and a switched capacitor array. One end of the first inductor L1 is connected to one end of the second inductor L2, and the other end of the first inductor L1 is separately connected to one end of the switched capacitor array and a first output node of the positive feedback unit 20. The other end of the second inductor L2 is separately connected to the other end of the switched capacitor array and a second output node of the positive feedback unit 20. One end of the first inductor L1 and one end of the second inductor L2 are connected to a first constant voltage node.

A specific structure of the switched capacitor array is not limited in this embodiment of the present disclosure, and may be an array formed by combining multiple capacitors and multiple switches that are connected in series or in parallel in a particular manner. By controlling the multiple capacitors to be turned on or turned off, a connection relationship among the multiple capacitors may be changed such that a capacitance value may be adjusted. For example, the switched capacitor array includes at least one switched capacitor branch, and any one of the foregoing switched capacitor branches includes at least one capacitor and a switch K that is connected in series to the capacitor. For example, as shown in FIG. 5, the switched capacitor branch includes a seventh capacitor C7, an eighth capacitor C8 and a switch K. One end of the seventh capacitor C7 is connected to the other end of the first inductor L1 and the first output node of the positive feedback unit 20, and the other end of the eighth capacitor C8 is connected to the second output node of the positive feedback unit 20 and the other end of the second inductor L2.

Any two or two or more of the foregoing at least one switched capacitor branch may be connected in series or in parallel, and capacitors in each switched capacitor branch may be adjustable capacitors or constant capacitors. In this way, an oscillation frequency of the oscillator may be changed by adjusting a capacitance value of each capacitor, and a capacitance value of the resonance unit 10 may be changed by controlling a switch in each switched capacitor branch to be turned on or turned off (a corresponding state is turned-off or turned-on), to change the oscillation frequency.

When both the source of the third MOS transistor M3 and the source of the fourth MOS transistor M4 are connected to the first power source VCC, both one end of the first inductor L1 and one end of the second inductor L2 are grounded, or when both the source of the third MOS transistor M3 and the source of the fourth MOS transistor M4 are grounded, both one end of the first inductor L1 and one end of the second inductor L2 are connected to the first power source VCC.

Optionally, a positive differential signal output end OUTP of the oscillator is disposed on a line connecting one end of the third capacitor C3 to one end of the fifth capacitor C5, and a negative differential signal output end OUTN of the oscillator is disposed on a line connecting one end of the fourth capacitor C4 to the other end of the sixth capacitor C6. The OUTP and the OUTN are two output ends of the oscillator. A phase of an oscillation signal output by the OUTP is opposite to a phase of an oscillation signal output by the OUTN such that the oscillation signals output by the two output ends are also referred to as a differential oscillation signal.

In the oscillator provided in this embodiment of the present disclosure, because the differential oscillation signal is generated by the resonance unit 10, by disposing the OUTP between the third MOS transistor M3 of the current source unit 30 and the first MOS transistor M1 of the positive feedback unit 20, and disposing the OUTN between the fourth MOS transistor M4 of the current source unit 30 and the second MOS transistor M2 of the positive feedback unit 20, the first MOS transistor and the second MOS transistor can isolate a positive differential oscillation signal and a negative differential oscillation signal from a load such that impact of the load on the positive differential oscillation signal and the negative differential oscillation signal can be reduced. In this way, sensitivity between the oscillation frequency of the oscillator and an output load is reduced, thereby further improving the phase noise performance.

Figure 6:
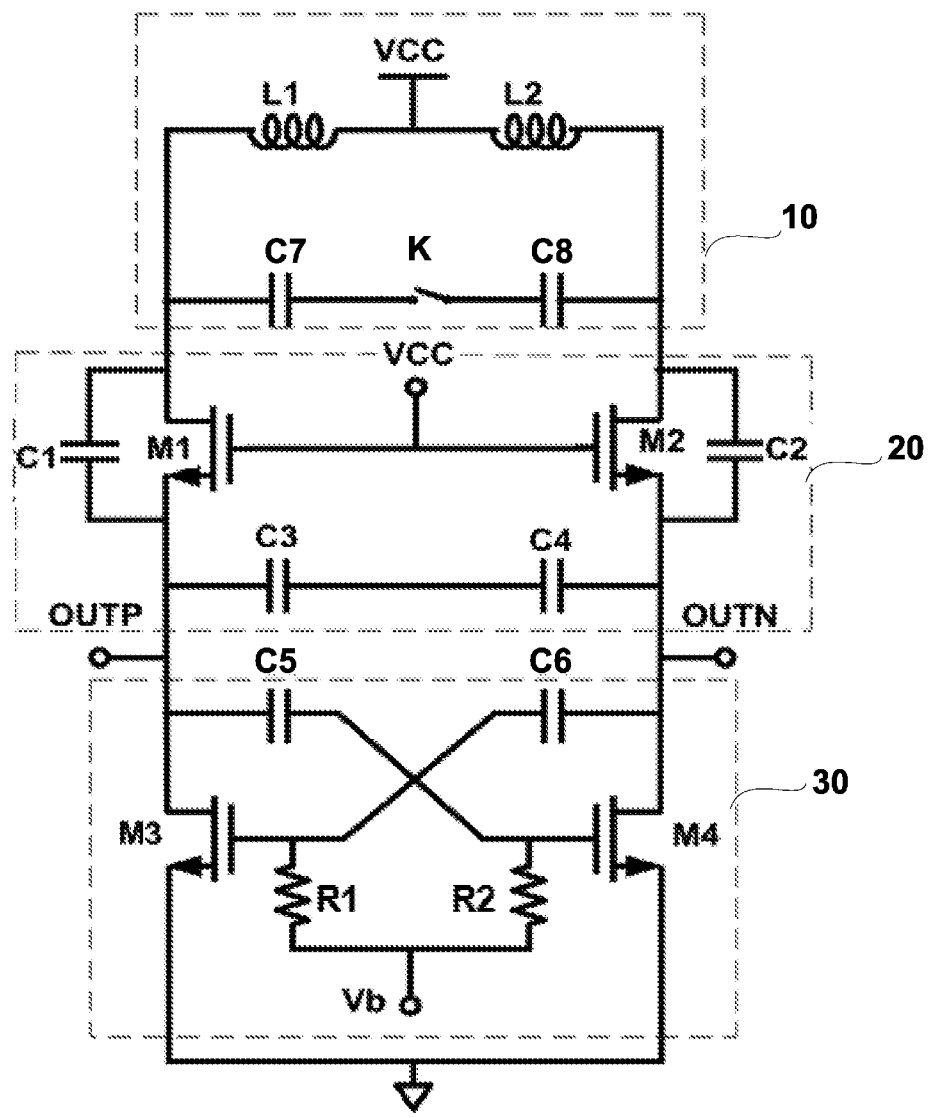
FIG. 6 is a fifth schematic structural diagram of an oscillator according to an embodiment of the present disclosure.
Figure 7:
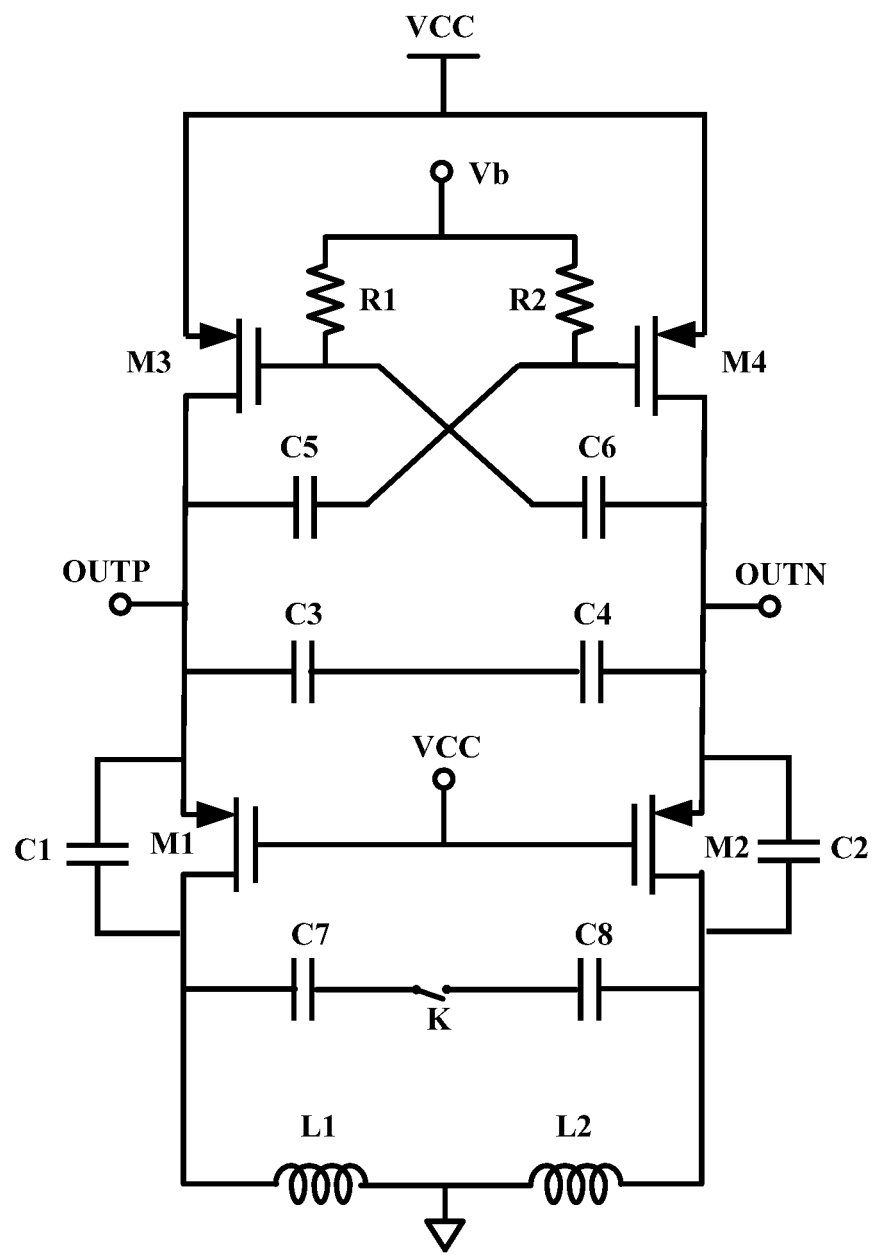
FIG. 7 is a sixth schematic structural diagram of an oscillator according to an embodiment of the present disclosure.

Optionally, in this embodiment of the present disclosure, both the first MOS transistor M1 and the second MOS transistor M2 may be P-type MOS transistors, or may be N-type MOS transistors. Both the third MOS transistor M2 and the fourth MOS transistor M4 may be P-type MOS transistors, or may be N-type MOS transistors. However, as types of transistors change, circuit connection manners are adjusted to an extent. FIG. 6 and FIG. 7 are used as examples for description below.

In one aspect, referring to FIG. 6, FIG. 6 is different from FIG. 5 in that When the first MOS transistor M1, the second MOS transistor M2, the third MOS transistor M3 and the fourth MOS transistor M4 are all N-type MOS transistors, in this embodiment of the present disclosure, both the source of the third MOS transistor and the source of the fourth MOS transistor M4 are grounded (that is, the second constant voltage node 104 is the ground), one end of the first inductor L1 and one end of the second inductor L2 are connected to the first power source VCC (that is, the first constant voltage node 105 is the first power source), the first terminal 101 of the first MOS transistor M1 is a drain, the second terminal 102 of the first MOS transistor M1 is a source, the first terminal 201 of the second MOS transistor M2 is a drain, and the second terminal 202 of the second MOS transistor M2 is a source, the first terminal 101 of the first MOS transistor M1 (the first output node of the positive feedback unit) is connected to one end of the seventh capacitor C7, and the second terminal 202 of the second MOS transistor is connected to the other end of the eighth capacitor C8 (the second output node of the positive feedback unit 20).

In another aspect, as shown in FIG. 7, FIG. 7 is different from FIG. 5 in that When the first MOS transistor M1, the second MOS transistor M2, the third MOS transistor M3 and the fourth MOS transistor M4 are all P-type MOS transistors, both the source of the third MOS transistor M3 and the source of the fourth MOS transistor M4 are connected to the first power source VCC (that is, the second constant voltage node 104 is the first power source VCC), one end of the first inductor L1 and one end of the second inductor L2 are grounded (that is, the first constant voltage node 105 is the ground), the first terminal 101 of the first MOS transistor M1 is a drain, the second terminal of the first MOS transistor M1 is a source, the first terminal 201 of the second MOS transistor M2 is a drain, the second terminal of the second MOS transistor M2 is a source, the first terminal 101 of the first MOS transistor M1 (the first output node of the positive feedback unit) is connected to one end of the seventh capacitor C7, and the second terminal 202 of the second MOS transistor is connected to the other end of the eighth capacitor C8 (the second output node of the positive feedback unit 20).

Figure 8:
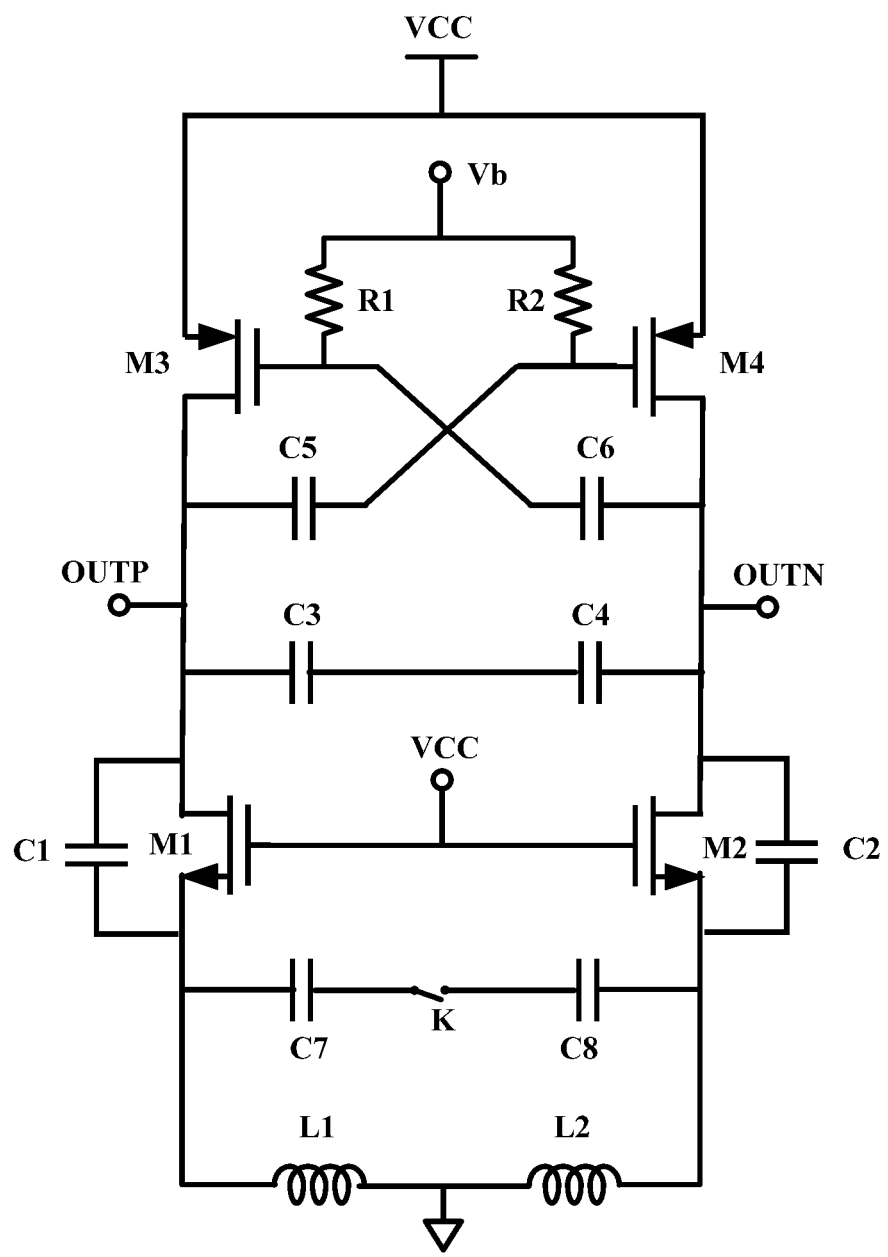
FIG. 8 is a seventh schematic structural diagram of an oscillator according to an embodiment of the present disclosure.

In still another aspect, as shown in FIG. 8, FIG. 8 is different from FIG. 5 in that When the first MOS transistor and the second MOS transistor are N-type MOS transistors, and the third MOS transistor and the fourth MOS transistor are P-type MOS transistors, the source of the third MOS transistor M3 and the source of the fourth MOS transistor M4 are connected to the first power source (that is, the second constant voltage node 104 is the first power source), one end of the first inductor L1 and one end of the second inductor L2 are grounded (that is, the first constant voltage node 105 is the ground), the first terminal 101 of the first MOS transistor M1 is a source, the second terminal 102 of the first MOS transistor M1 is a drain, the first terminal 201 of the second MOS transistor M2 is a source, and the second terminal of the second MOS transistor M2 is a drain.

Figure 9:
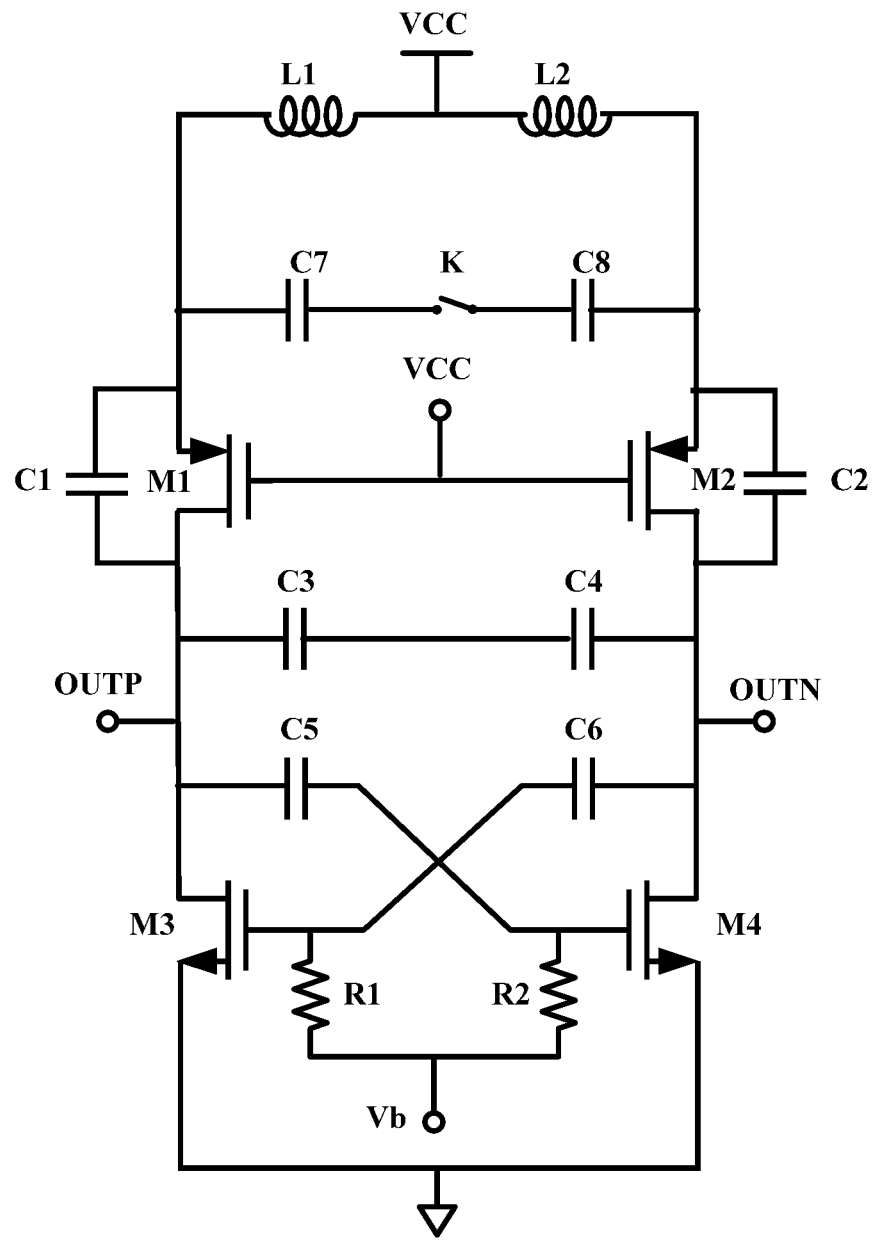
FIG. 9 is a tenth schematic structural diagram of an oscillator according to an embodiment of the present disclosure.

In still another aspect, as shown in FIG. 9, FIG. 9 is different from FIG. 5 in that When the first MOS transistor and the second MOS transistor are P-type MOS transistors, and the third MOS transistor and the fourth MOS transistor are N-type MOS transistors, the source of the third MOS transistor M3 and the source of the fourth MOS transistor M4 are grounded, the first terminal 101 of the first MOS transistor is a source, the second terminal 102 of the first MOS transistor M1 is a drain, the first terminal 201 of the second MOS transistor M2 is a source, and the second terminal 202 of the second MOS transistor M2 is a drain.

Described circuit principles, of the oscillator provided in the embodiments of the present disclosure, shown in FIG. 6 to FIG. 9 are all the same as circuit principles shown in FIG. 2, FIG. 3, FIG. 4A and FIG. 5. For details, refer to the circuit principles shown in FIG. 2, FIG. 3, FIG. 4A and FIG. 5, and details are not described in this embodiment of the present disclosure again.

Figure 10:
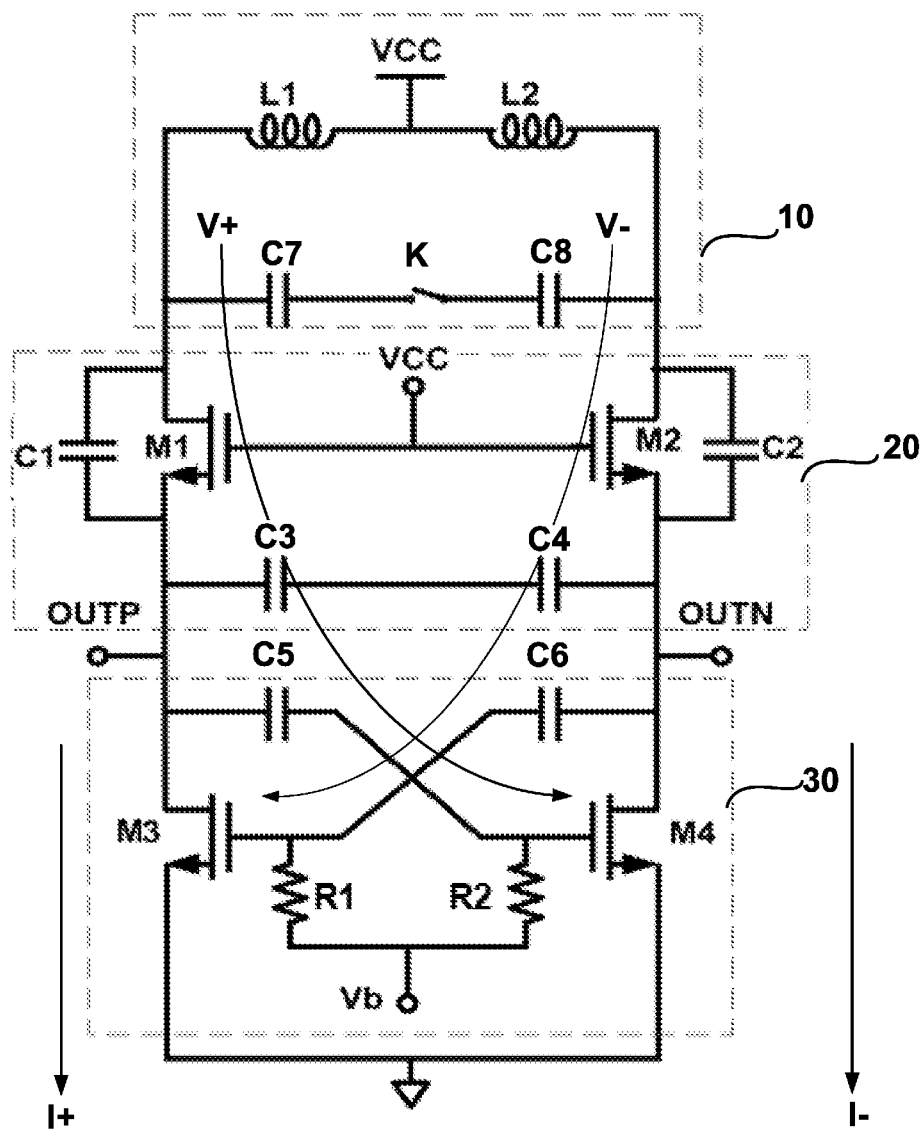
FIG. 10 is an eleventh schematic structural diagram of an oscillator according to an embodiment of the present disclosure.

As shown FIG. 10, in an oscillation process, a direct current bias adjustable current source unit 30 is formed by the third MOS transistor M3, the fourth MOS transistor M4, the first resistor R1, the second resistor R2, the fifth capacitor C5 and the sixth capacitor C6. The current source unit 30 provides a current I+ and a current I- (I+ and I- are currents having same magnitude but having opposite phases) for branches at two sides. The positive feedback unit 20 is formed by the first MOS transistor M1, the second MOS transistor M2, the first capacitor C1, the second capacitor C2, the third capacitor C3, and the fourth capacitor C4. The resonance unit formed by L1, L2, the seventh capacitor C7 and the eighth capacitor C8 generates a differential oscillation signal V+ and a differential oscillation signal V-, amplifies gains of the differential oscillation signal V+ and the differential oscillation signal V- through the positive feedback unit 20, to obtain a positive differential output oscillation signal and a negative differential output oscillation signal, and feeds back the positive differential output oscillation signal and the negative differential output oscillation signal to the gate of the third MOS transistor and the gate of the fourth MOS transistor. When amplitude of the positive differential output oscillation signal and amplitude of the negative differential output oscillation signal are relatively high, the current I+ and the current I- that are provided by the current source unit 30 for the branches at the two sides may be reduced by adjusting the voltage of the adjustable power source Vb such that the amplitude of the differential oscillation signal output by the resonance unit 10 is reduced, and finally, the differential oscillation signal output by the oscillator are stable. Further, because the differential oscillation signal is generated by the resonance unit 10, by disposing the OUTP between the third MOS transistor M3 of the current source unit 30 and the first MOS transistor M1 of the positive feedback unit 20, and disposing the OUTN between the fourth MOS transistor M4 of the current source unit 30 and the second MOS transistor M2 of the positive feedback unit 20, the first MOS transistor and the second MOS transistor can isolate a positive differential oscillation signal and a negative differential oscillation signal from a load of the oscillator (that is, a component providing oscillation signals in the oscillator) such that impact of the load on the positive differential oscillation signal and the negative differential oscillation signal can be reduced. In this way, sensitivity between the oscillation frequency of the oscillator and the load of the oscillator is reduced, thereby further improving the phase noise performance.

Figure 11:
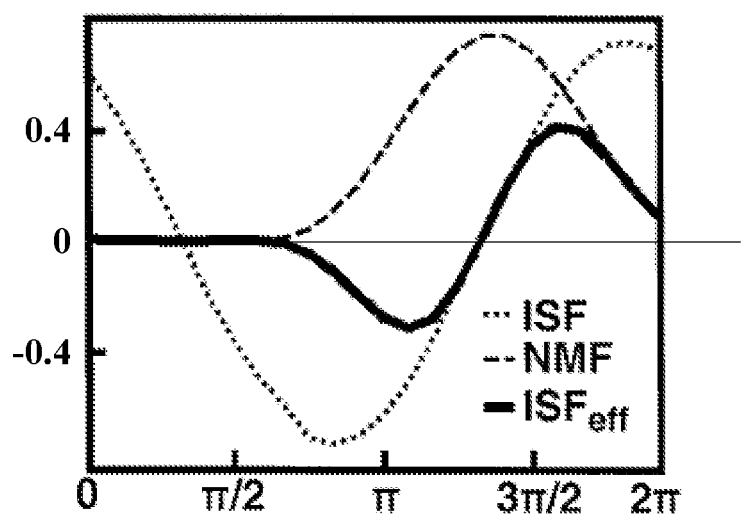
FIG. 11 is a curve chart of a simulation ISF function of an oscillator according to an embodiment of the present disclosure.

The oscillator having low power consumption and low phase noise shown in FIG. 6 to FIG. 10 is simulated below to obtain a simulation diagram of an $ISF_{eff}$ function curve shown in FIG. 11. This is used as an example to further describe the oscillator provided in the embodiments of the present disclosure. Further, when a current pulse is injected into the differential output oscillation signal output by the oscillator shown in FIG. 6 to FIG. 10, simulation calculation is performed to obtain a curve chart, that is, FIG. 11, of an $ISF_{eff}$ function of the oscillator having low power consumption and low phase noise provided in the embodiments of the present disclosure, as shown in FIG. 11 (The 0 line in FIG. 11 is an auxiliary reference line made in this embodiment of the present disclosure when values of an $ISF_{eff}$ and values of an NMF of the phase noise are stable. In this embodiment of the present disclosure, values of an $ISF_{eff}$ curve, an ISF curve and an NMF curve of the phase noise that are tangent to the auxiliary reference line are marked as 0. In an actual simulation process, values of the $ISF_{eff}$ curve, the ISF curve and the NMF curve of the phase noise are all greater than 0).

A calculation formula of the phase noise of the oscillator having low power consumption and low phase noise provided in the embodiments of the present disclosure is:

$$L\{\Delta\omega\} = \frac{i_n^2/\Delta f}{2q_{max}^2} \times \frac{\Gamma_{eff,rms}^2}{\Delta\omega^2}, \quad (3)$$

where $\Delta\omega$ is a frequency offset of a carrier processed or generated by the oscillator, $i_n^2/\Delta f$ is power spectral density of current noise, $\Gamma_{eff,rms}^2$ is a root mean square value of a $\Gamma_{eff}$ ($\omega t$) function, and $q_{max}$ is a maximum charge amount of a current noise source. $L\{\Delta\omega\}$ It should be noted that lower phase noise of the oscillator indicates better phase noise performance of the oscillator, that is, a smaller value of $L\{\Delta\omega\}$ of the oscillator indicates better phase noise performance of the oscillator.

Further, $\Gamma_{eff}(\omega t)=\Gamma(\omega t)\times\alpha(\omega t)(4)$, where $\Gamma(\omega t)$ is an ISF, and $\alpha(\omega t)$ is an NMF in which a phase changes over time.

It can be known from formula (3) that when values of $q_{max}^2$, $\Delta\omega^2$ and $i_n^2/\Delta f$ remain unchanged, or when a value of $$\frac{i_n^2/\Delta f}{2q_{max}^2} \times \frac{1}{\Delta\omega^2}$$

remains unchanged, the phase noise of the oscillator can be effectively reduced by reducing a value of the $\Gamma_{eff}$ ($\omega t$) function (that is, $\Gamma_{eff,rms}^2$ in the formula), thereby improving the phase noise performance of the oscillator.

Figure 1A:
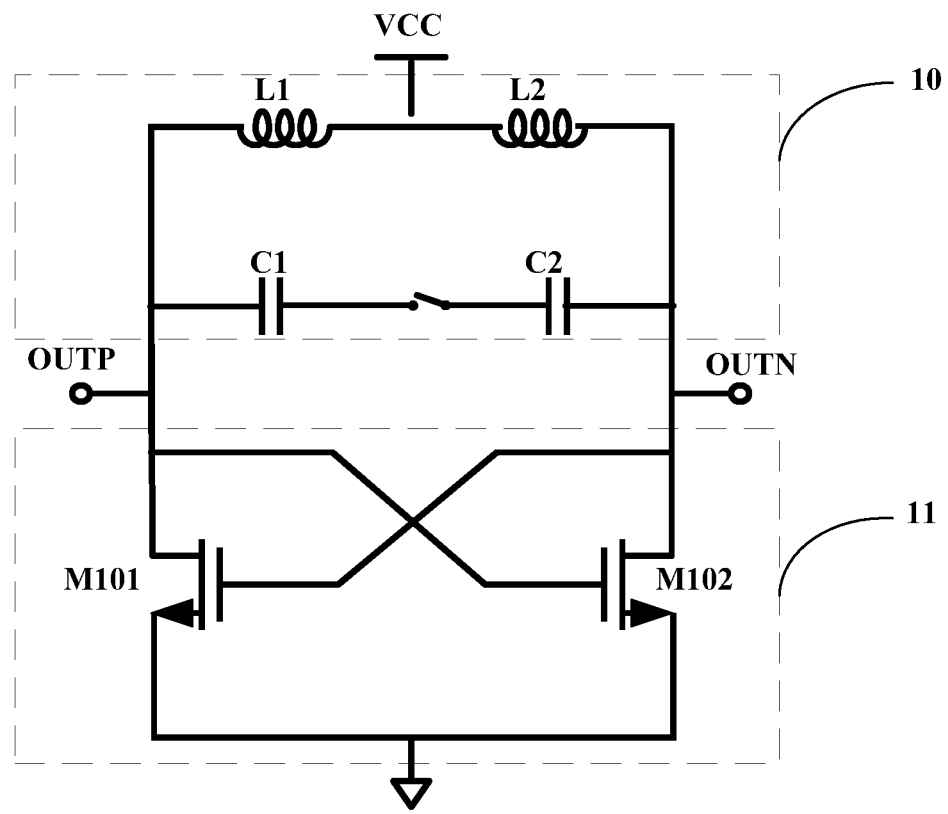
FIG. 1A is a schematic structural diagram of a cross coupled negative resistance oscillator.
Figure 1B:
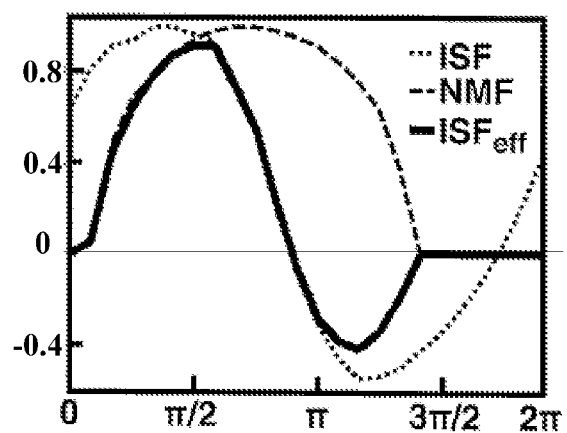
FIG. 1B is a curve chart of a simulation ISF function of a cross coupled negative resistance oscillator.

For example, it can be known from FIG. 10 that, in the oscillator provided in the embodiments of the present disclosure, the start-up gain is provided for the oscillator by the first MOS transistor and the second MOS transistor in the positive feedback unit 20 when the oscillator oscillates, to amplify noise of a component in the oscillator. A positive alternating current feedback is formed by the first capacitor C1, the third capacitor C3, the second capacitor C2 and the fourth capacitor C4 such that the oscillator maintains an oscillation state and outputs the differential oscillation signal. Because the gate of the first MOS transistor M1 and the gate of the second MOS transistor M2 are connected to the first power source VCC, and the first terminal 101 and the second terminal 102 of the first MOS transistor M1 are respectively connected to one end and the other end of the first capacitor C1, and the first terminal 201 and the second terminal 202 of the second MOS transistor are respectively connected to one end and the other end of the second capacitor C2, the first MOS transistor M1 and the second MOS transistor M2 can be turned on only when amplitude of a positive differential output oscillation signal and the absolute value of the gate-source voltage difference of the first MOS transistor M1 are greater than the threshold voltage of the first MOS transistor M1, and amplitude of a negative differential output oscillation signal and the absolute value of the gate-source voltage difference of the second MOS transistor M2 are greater than the threshold voltage of the second MOS transistor M2. In this way, a time for which the first MOS transistor and the second MOS transistor are turned on within an oscillation period is reduced, that is, a time for which the current source unit and the positive feedback unit 20 inject current noise into the resonance unit 10 within an oscillation period is reduced. Therefore, when a current pulse is injected into the oscillator provided in the embodiments of the present disclosure at different time points, a time for which a noise current in the current source unit 30 and the positive feedback unit 20 is injected into the resonance unit is reduced, that is, a time for which a value of the NMF of the oscillator provided in the embodiments of the present disclosure is 0 becomes longer. In this way, a value of the $ISF_{eff}$ of the oscillator having low power consumption and low phase noise provided in the embodiments of the present disclosure is 0 within ½ of an oscillation period (for example, a time length from 0 to π shown in FIG. 11), and within rest of the oscillation period, a value of the NMF always corresponds to the value of the ISF being 0 at each moment. FIG. 1A shows the cross coupled negative resistance oscillator in the other approaches, and a curve chart of an $ISF_{eff}$ of the cross coupled negative resistance oscillator is shown in FIG. 1B. It can be known from FIG. 1B that within a time length from 3π/2 to 2π within an oscillation period, because a value of the NMF is 0, a value of the $ISF_{eff}$ of the cross coupled negative resistance oscillator is 0 within the time length from 3π/2 to 2π. That is, within ¼ of the oscillation period, the value of the $ISF_{eff}$ is 0, and within a time length from 0 to it/2 within the oscillation period, because a maximum value of the NMF corresponds to a maximum value of the ISF, within the time length from 0 to π/2 within the oscillation period, the value of the $ISF_{eff}$ of the cross coupled negative resistance oscillator is relatively large. However, in the oscillator provided in the embodiments of the present disclosure, a phase shift by 90 degrees exists, using a phase shift between the first capacitor and the second capacitor, between a voltage waveform and a current waveform of the differential oscillation signal such that within an oscillation period, the maximum value of the NMF corresponds to a minimum value of the ISF. According to the formula (4), because $\Gamma_{eff}(\omega t)$ is the $ISF_{eff}$, $\Gamma(\omega t)$ is the ISF, and $\alpha(\omega t)$ is the NMF in which a phase changes over time, the value of the $ISF_{eff}$ may be reduced within an oscillation period, thereby reducing the phase noise of the oscillator provided in the embodiments of the present disclosure. Therefore, values of the $ISF_{eff}$ within the rest of the period are all less than values of the $ISF_{eff}$ of the cross coupled negative resistance oscillator shown in FIG. 1A. Therefore, it can be known that a value of the $ISF_{eff}$ of the oscillator provided in the embodiments of the present disclosure within an oscillation period is less than the value of the $ISF_{eff}$ of the cross coupled negative resistance oscillator shown in FIG. 1A. Therefore, compared with the other approaches, the oscillator provided in the embodiments of the present disclosure has lower phase noise and better phase noise performance.

For example, the following shows parameters of phase noise, power consumption and the like of the oscillator provided in the embodiments of the present disclosure and the cross-coupled oscillator, where the parameters are obtained by collecting statistics on and respectively calculating simulation data obtained by simulating the oscillator provided in the embodiments of the present disclosure and the cross-coupled oscillator under same process conditions when the oscillation frequency is 16 gigahertz (GHz), as shown in Table 1.

TABLE 1

| Structure | Power consumption in milliwatts (mW) | Adjustment range 16 GHz (%) | Phase noise @ 1 megahertz (MHz) (decibels relative to carrier (dBc)/hertz (Hz)) | FOM @ 1 MHz | FOMT @ 1 MHz |
| --- | --- | --- | --- | --- | --- |
| Cross-coupled oscillator | 24.4 | 12.2 | −114.4 | 185.42 | 184.69 |
| Oscillator in the embodiments of the present disclosure | 20.5 | 13.45 | −122.1 | 193.18 | 191.98 |

It can be known from Table 1 that, under same process conditions, when the oscillation frequency is 16 GHz, the power consumption of the oscillator provided in the embodiments of the present disclosure is 20.5 mW, a power consumption value is lower than that of the cross-coupled oscillator, and the oscillator in the embodiments of the present disclosure has a larger adjustment range. In addition, under same conditions, the oscillator provided in the embodiments of the present disclosure has phase noise of −122.1 dBc/Hz, which is lower than that of the cross-coupled oscillator, thereby having better phase noise performance compared with the cross-coupled oscillator. In addition, it can be seen that the oscillator provided in the embodiments of the present disclosure has a relatively high figure of merit (FOM) and a relatively high figure of merit with tuning range (FOMT).

An embodiment of the present disclosure further provides a terminal. The terminal includes at least a short-range communications apparatus and the oscillator provided in the embodiments of the present disclosure. The oscillator is configured to provide a local carrier signal for the short-range communications apparatus. The short-range communications apparatus may be any one of or a combination of the following, a BLUETOOTH module in the terminal, a WI-FI module, or any apparatus requiring a local carrier signal. For example, the short-range communications apparatus in the terminal may be a BLUETOOTH module and WI-FI, or may be a BLUETOOTH module or WI-FI.

An embodiment of the present disclosure further provides a base station. The base station includes at least a transceiver and a phase-locked loop circuit. The phase-locked loop circuit includes the oscillator having low power consumption and low phase noise provided in the embodiments of the present disclosure. The oscillator having low power consumption and low phase noise is configured to provide a local carrier signal for the transceiver of the base station.

It should be noted that, the terminal and the base station are merely examples to describe products to which the oscillator having low power consumption and low phase noise provided in the embodiments of the present disclosure is applied, and are not intended to limit application of the oscillator having low power consumption and low phase noise provided in the embodiments of the present disclosure. The oscillator having low power consumption and low phase noise provided in the embodiments of the present disclosure may be applied to any scenario requiring low power consumption or low phase noise performance, and any product requiring low power consumption or low phase noise performance.

Finally, it should be noted that the foregoing embodiments are merely intended for describing the technical solutions of the present disclosure but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present disclosure.

The invention claimed is:

1. An oscillator, comprising:
a cross coupled current source circuit;
a resonance circuit coupled to the current source circuit and configured to generate a differential oscillation signal having a first oscillation frequency; and
a positive feedback circuit coupled between the current source circuit and the resonance circuit, wherein the positive feedback circuit comprises a plurality of capacitors, a plurality of transistors, and a first constant voltage source, and wherein the positive feedback circuit is configured to:
receive the differential oscillation signal from the resonance circuit; and
amplify a gain of the differential oscillation signal to obtain a differential output oscillation signal, and
wherein the current source circuit is configured to provide an adjustable bias current for the resonance circuit and the positive feedback circuit.

2. The oscillator of claim 1, wherein the resonance circuit is further configured to output the differential oscillation signal to the current source circuit through the positive feedback circuit, and wherein the current source circuit is further configured to adjust the adjustable bias current by controlling magnitude of a bias voltage and according to the differential oscillation signal received from the resonance circuit to adjust amplitude of the differential output oscillation signal.

3. The oscillator of claim 1, wherein the positive feedback circuit comprises a first metal-oxide-semiconductor (MOS) transistor, a second MOS transistor, a first capacitor, a second capacitor, a third capacitor, and a fourth capacitor, wherein a first terminal of the first MOS transistor is separately coupled to the resonance circuit and a first end of the first capacitor and configured as a first output node, wherein a second terminal of the first MOS transistor is separately coupled to a second end of the first capacitor and a first end of the third capacitor, wherein a gate of the first MOS transistor and a gate of the second MOS transistor are coupled to the first constant voltage source, wherein a first terminal of the second MOS transistor is separately coupled to the resonance circuit and a first end of the second capacitor, wherein a second terminal of the second MOS transistor is separately coupled to a second end of the second capacitor and a first end of the fourth capacitor and configured as a second output node, wherein a second end of the fourth capacitor is coupled to a second end of the third capacitor, wherein the first end of the third capacitor and the first end of the fourth capacitor are coupled to the current source circuit, wherein a positive differential signal output end is disposed between the first end of the third capacitor and a third output node of the current source circuit, and wherein a negative differential signal output end is disposed between the first end of the fourth capacitor and a fourth output node of the current source circuit.

4. The oscillator of claim 3, wherein the first constant voltage source is a first power source.

5. The oscillator of claim 1, wherein the resonance circuit comprises:
a first inductor;
a second inductor, wherein a first end of the second inductor is coupled to a first end of the first inductor; and
a switched capacitor array, wherein a second end of the first inductor is separately coupled to a first end of the switched capacitor array and a first output node of the positive feedback circuit, wherein a second end of the second inductor is separately coupled to a second end of the switched capacitor array and a second output node of the positive feedback circuit, and wherein the first end of the first inductor and the first end of the second inductor are coupled to a first constant voltage node.

6. The oscillator of claim 5, wherein the current source circuit comprises a third metal-oxide-semiconductor (MOS) transistor, a fourth MOS transistor, a fifth capacitor, a sixth capacitor, a first resistor, and a second resistor, wherein a gate of the third MOS transistor is separately coupled to a first end of the sixth capacitor and a first end of the first resistor, wherein a drain of the third MOS transistor is separately coupled to a first end of the fifth capacitor and a first end of a third capacitor and configured as a third output node, wherein a gate of the fourth MOS transistor is separately coupled to a second end of the fifth capacitor and a first end of the second resistor, wherein a drain of the fourth MOS transistor is separately coupled to a second end of the sixth capacitor and a first end of a fourth capacitor and configured as a fourth output node, wherein an adjustable power source is coupled to both a second end of the first resistor and a second end of the second resistor and configured to provide a bias voltage for the current source circuit, wherein the current source circuit is further configured to provide the adjustable bias current for the resonance circuit and the positive feedback circuit through the adjustable power source, and wherein a source of the third MOS transistor and a source of the fourth MOS transistor are coupled to a second constant voltage node.

7. The oscillator of claim 6, wherein a first MOS transistor, a second MOS transistor, the third MOS transistor, and the fourth MOS transistor are negative channel MOS (NMOS) transistors, wherein a first terminal of the first MOS transistor and a first terminal of the second MOS transistor are drains, wherein a second terminal of the first MOS transistor and a second terminal of the second MOS transistor are sources, wherein the first constant voltage node is a first power source, and wherein the second constant voltage node is a ground.

8. The oscillator of claim 6, wherein a first MOS transistor, a second MOS transistor, the third MOS transistor, and the fourth MOS transistor are positive channel MOS (PMOS) transistors, wherein a first terminal of the first MOS transistor and a first terminal of the second MOS transistor are drains, wherein a second terminal of the first MOS transistor and a second terminal of the second MOS transistor are sources, wherein the first constant voltage node is a ground, and wherein the second constant voltage node is a first power source.

9. The oscillator of claim 6, wherein a first MOS transistor and a second MOS transistor are positive channel MOS (PMOS) transistors, wherein the third MOS transistor and the fourth MOS transistor are negative channel MOS (NMOS) transistors, wherein a first terminal of the first MOS transistor and a first terminal of the second MOS transistor are sources, wherein a second terminal of the first MOS transistor and a second terminal of the second MOS transistor are drains, wherein the first constant voltage node is a first power source, and wherein the second constant voltage node is a ground.

10. The oscillator of claim 6, wherein a first MOS transistor and a second MOS transistor are negative channel MOS (NMOS) transistors, wherein the third MOS transistor and the fourth MOS transistor are positive channel MOS (PMOS) transistors, wherein a first terminal of the first MOS transistor and a first terminal of the second MOS transistor are sources, wherein a second terminal of the first MOS transistor and a second terminal of the second MOS transistor are drains, wherein the first constant voltage node is a ground, and wherein the second constant voltage node is being a first power source.

11. The oscillator of claim 5, wherein the switched capacitor array comprises at least one switched capacitor branch, wherein the at least one switched capacitor branch comprises a seventh capacitor, a switch, and an eighth capacitor, wherein a first end of the seventh capacitor is coupled to the second end of the first inductor and the first output node of the positive feedback circuit, wherein a second end of the seventh capacitor is coupled to a second end of the eighth capacitor using the switch, and wherein a first end of the eighth capacitor is coupled to the second output node of the positive feedback circuit and the second end of the second inductor.

12. The oscillator of claim 11, wherein the seventh capacitor and the eighth capacitor are adjustable capacitors.

13. A terminal, comprising:
a short-range communications apparatus; and
an oscillator coupled to the short-range communications apparatus and configured to provide a local carrier signal for the short-range communications apparatus, and wherein the oscillator comprises:
a cross coupled current source circuit;
a resonance circuit coupled to the current source circuit and configured to generate a differential oscillation signal having a first oscillation frequency; and
a positive feedback circuit coupled between the current source circuit and the resonance circuit, wherein the positive feedback circuit comprises a plurality of capacitors, a plurality of transistors, and a first constant voltage source, and wherein the positive feedback circuit is configured to:
receive the differential oscillation signal from the resonance circuit; and
amplify a gain of the differential oscillation signal to obtain a differential output oscillation signal, and wherein the current source circuit is configured to provide an adjustable bias current for the resonance circuit and the positive feedback circuit.

14. The terminal of claim 13, wherein the resonance circuit is further configured to output the differential oscillation signal to the current source circuit through the positive feedback circuit, and wherein the current source circuit is further configured to adjust the adjustable bias current by controlling magnitude of a bias voltage to adjust amplitude of the differential output oscillation signal according to the differential oscillation signal received from the resonance circuit.

15. The terminal of claim 13, wherein the positive feedback circuit comprises a first metal-oxide-semiconductor (MOS) transistor, a second MOS transistor, a first capacitor, a second capacitor, a third capacitor, and a fourth capacitor, wherein a first terminal of the first MOS transistor is separately coupled to the resonance circuit and a first end of the first capacitor and configured as a first output node, wherein a second terminal of the first MOS transistor is separately coupled to a second end of the first capacitor and a first end of the third capacitor, wherein a gate of the first MOS transistor and a gate of the second MOS transistor are coupled to the first constant voltage source, wherein a first terminal of the second MOS transistor is separately coupled to the resonance circuit and a first end of the second capacitor, wherein a second terminal of the second MOS transistor is separately coupled to a second end of the second capacitor and a first end of the fourth capacitor and configured as a second output node, wherein a second end of the fourth capacitor is coupled to a second end of the third capacitor, wherein the first end of the third capacitor and the first end of the fourth capacitor are coupled to the current source circuit, wherein a positive differential signal output end is disposed between the first end of the third capacitor and a third output node of the current source circuit, and wherein a negative differential signal output end is disposed between the first end of the fourth capacitor and a fourth output node of the current source circuit.

16. The terminal of claim 13, wherein the resonance circuit comprises:
a first inductor;
a second inductor, wherein a first end of the second inductor is coupled to a first end of the first inductor; and
a switched capacitor array, wherein a second end of the first inductor is separately coupled to a first end of the switched capacitor array and a first output node of the positive feedback circuit, wherein a second end of the second inductor is separately coupled to a second end of the switched capacitor array and a second output node of the positive feedback circuit, and wherein the first end of the first inductor and the first end of the second inductor are coupled to a first constant voltage node.

17. A base station, comprising:
a transceiver; and
a phase-locked loop circuit coupled to the transceiver, wherein the phase-locked loop circuit comprises an oscillator configured to provide a local carrier signal for the transceiver, and wherein the oscillator comprises:
a cross coupled current source circuit;
a resonance circuit coupled to the current source circuit and configured to generate a differential oscillation signal having a first oscillation frequency; and a positive feedback circuit coupled between the current source circuit and the resonance circuit, wherein the positive feedback circuit comprises a plurality of capacitors, a plurality of transistors, and a first constant voltage source, and wherein the positive feedback circuit is configured to:
  receive the differential oscillation signal from the resonance circuit; and
  amplify a gain of the differential oscillation signal to obtain a differential output oscillation signal, and
wherein the current source circuit is configured to provide an adjustable bias current for the resonance circuit and the positive feedback circuit.

18. The base station of claim 17, wherein the resonance circuit is further configured to output the differential oscillation signal to the current source circuit through the positive feedback circuit, and wherein the current source circuit is further configured to adjust the adjustable bias current by controlling magnitude of a bias voltage to adjust amplitude of the differential output oscillation signal according to the differential oscillation signal received from the resonance circuit.

19. The base station of claim 17, wherein the positive feedback circuit comprises a first metal-oxide-semiconductor (MOS) transistor, a second MOS transistor, a first capacitor, a second capacitor, a third capacitor, and a fourth capacitor, wherein a first terminal of the first MOS transistor is separately coupled to the resonance circuit and a first end of the first capacitor and configured as a first output node, wherein a second terminal of the first MOS transistor is separately coupled to a second end of the first capacitor and a first end of the third capacitor, wherein a gate of the first MOS transistor and a gate of the second MOS transistor are coupled to the first constant voltage source, wherein a first terminal of the second MOS transistor is separately coupled to the resonance circuit and a first end of the second capacitor, wherein a second terminal of the second MOS transistor is separately coupled to a second end of the second capacitor and a first end of a fourth capacitor and configured as a second output node, wherein a second end of the fourth capacitor is coupled to a second end of the third capacitor, wherein the first end of the third capacitor and the first end of the fourth capacitor are coupled to the current source circuit, wherein a positive differential signal output end is disposed between the first end of the third capacitor and a third output node of the current source circuit, and wherein a negative differential signal output end is disposed between the first end of the fourth capacitor and a fourth output node of the current source circuit.

20. The base station of claim 17, wherein the resonance circuit comprises:
  a first inductor;
  a second inductor, wherein a first end of the second inductor is coupled to a first end of the first inductor; and
  a switched capacitor array, wherein a second end of the first inductor is separately coupled to a first end of the switched capacitor array and a first output node of the positive feedback circuit, wherein a second end of the second inductor is separately coupled to a second end of the switched capacitor array and a second output node of the positive feedback circuit, and wherein the first end of the first inductor and the first end of the second inductor are coupled to a first constant voltage node.

* * * * *

UNITED STATES PATENT AND TRADEMARK OFFICE
CERTIFICATE OF CORRECTION

PATENT NO. : 10,622,943 B2  
APPLICATION NO. : 16/232726  
DATED : April 14, 2020  
INVENTOR(S) : Kai Shi, Lei Lu and Lei Xie Page 1 of 1

It is certified that error appears in the above-identified patent and that said Letters Patent is hereby corrected as shown below:

In the Claims

Claim 10, Column 23, Line 35: "being a first power source" should read "a first power source"

Signed and Sealed this  
Ninth Day of June, 2020

Andrei Iancu  
*Director of the United States Patent and Trademark Office*